(12) United States Patent
Yamamoto

(10) Patent No.: US 10,516,399 B2
(45) Date of Patent: Dec. 24, 2019

(54) CIRCUIT DEVICE, OSCILLATOR, ELECTRONIC APPARATUS, AND VEHICLE

(71) Applicant: SEIKO EPSON CORPORATION, Tokyo (JP)

(72) Inventor: Takehiro Yamamoto, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 5 days.

(21) Appl. No.: 15/958,311

(22) Filed: Apr. 20, 2018

(65) Prior Publication Data

US 2018/0316355 A1 Nov. 1, 2018

(30) Foreign Application Priority Data

Apr. 28, 2017 (JP) .................. 2017-089278

(51) Int. Cl.
| | |
|---|---|
| *H03L 3/00* | (2006.01) |
| *H03L 5/02* | (2006.01) |
| *G06F 1/04* | (2006.01) |
| *H03L 1/02* | (2006.01) |

(52) U.S. Cl.
CPC .................. *H03L 3/00* (2013.01); *G06F 1/04* (2013.01); *H03L 1/02* (2013.01); *H03L 5/02* (2013.01)

(58) Field of Classification Search
CPC ..... H03L 3/00; H03L 5/02; H03L 1/02; G06F 1/04; G01K 7/32

USPC ................................. 331/2, 44, 48
See application file for complete search history.

(56) References Cited

U.S. PATENT DOCUMENTS

| | | | | |
|---|---|---|---|---|
| 5,398,007 A | * | 3/1995 | Yamazaki | ................. G06F 1/08 327/114 |
| 8,089,318 B2 | * | 1/2012 | Yeung | ....................... G06F 1/12 327/156 |
| 2009/0160570 A1 | | 6/2009 | Inoue | |
| 2016/0047695 A1 | * | 2/2016 | Inoue | ...................... G01K 7/32 377/25 |

FOREIGN PATENT DOCUMENTS

| | | |
|---|---|---|
| JP | H10-4347 A | 1/1998 |
| JP | 2008-193499 A | 8/2008 |
| JP | 2009-151600 A | 7/2009 |

* cited by examiner

*Primary Examiner* — Jeffrey M Shin
(74) *Attorney, Agent, or Firm* — Oliff PLC

(57) ABSTRACT

A circuit device includes a first oscillation circuit, a second oscillation circuit, a clock signal output circuit adapted to output a clock signal based on an output signal of the first oscillation circuit, and an output control circuit adapted to perform output control of the clock signal output circuit. The output control circuit includes a counter circuit adapted to perform a counting process based on an output signal of the second oscillation circuit, and the counter circuit outputs an output enable signal of the clock signal to the clock signal output circuit based on a result of the counting process.

19 Claims, 19 Drawing Sheets

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, a vehicle and so on.

2. Related Art

In the past, there has been known oscillators such as a temperature compensated crystal oscillator (TCXO), an oven controlled crystal oscillator (OCXO), and a simple packaged crystal oscillator (SPXO). For example, the TCXO is an oscillator arranged to be able to obtain a stable oscillation frequency with respect to a variation in environmental temperature by compensating the temperature characteristics of the oscillation frequency provided to a quartz crystal resonator.

In such an oscillator, since an oscillation signal gradually grows to make the transition to a stable state of the oscillation at the start-up (start of the oscillation), a variety of types of control are performed at the time of start-up in some cases. As such a technology, there can be cited technologies disclosed in, for example, JP-A-2008-193499 (Document 1), JP-A-2009-151600 (Document 2) and JP-A-10-4347 (Document 3). In Document 1, an oscillation circuit has an integration circuit for integrating an oscillation signal, and a discharge circuit for discharging the charge integrated by the integration circuit, and outputs a clock signal based on the oscillation signal in the case in which an integration voltage of the integration circuit reaches a predetermined voltage. In Document 2, the pulse number of the oscillation circuit is counted using a counter, a bias current of the oscillation circuit is increased until the count value of the counter reaches a predetermined number to accelerate the start-up of the oscillation circuit, and in the case in which the count value has reached the predetermined value, the bias current of the oscillation circuit is decreased.

Further, in Document 3, the oscillation clocks of the oscillator is counted by a counter, and when it has been detected that the frequency of the oscillation clock has reached a frequency determined in advance, the clock is output. In Document 3, the count operation and the reset operation of the counter are controlled by a CR oscillator.

In such an oscillator as described above, there is a problem that there is a possibility that an appropriate clock signal (e.g., with an appropriate duty) cannot be output at the time of start-up in the case in which there occurs an environmental variation or a process variation.

For example, as in the case of Document 1 described above, there can be cited a related art technology of integrating the output signal of the oscillation circuit to control the output of the clock signal. However, since the output of the clock signal is controlled using an analog process, it is difficult to deal with a broad variation range of the environmental temperature, a process variation, and so on, and thus, it is difficult to output an appropriate clock signal satisfying the specifications at the time of start-up. For example, when the oscillation signal grows to some extent, the integration voltage reaches the predetermined voltage to output the clock signal. However, if the growth of the oscillation signal is insufficient at that moment, there is a possibility that the clock signal with an appropriate duty cannot be obtained. There is a possibility that the duty at the time of start-up varies due to the broad variation range of the environmental temperature, the process variation, and so on to fail to satisfy the specifications. For example, in the on-board use or the like, the variation in the environmental temperature is large, and therefore, it is necessary to deal with a broad temperature range.

Further, as in Document 2 described above, there is a related-art technology using a counter for controlling the oscillation circuit at the time of start-up. However, in Document 2, the counter is used for the control for accelerating the start-up of the oscillation circuit.

Further, as in Document 3 described above, there is a related-art technology of counting the clock of the oscillator. However, in Document 3, the counter is used for detecting whether or not the frequency has reached a predetermined value, and there is no disclosure related to the duty. Further, in Document 3, the output of the CR oscillator is for controlling the counting operation and the reset operation of the counter, but the output of the CR oscillator is not subject to the counting operation.

SUMMARY

An advantage of some aspects of the invention is to solve at least a part of the problems described above, and the invention can be implemented as the following forms or embodiments.

An aspect of the invention relates to a circuit device including a first oscillation circuit adapted to oscillate an resonator, a second oscillation circuit, a clock signal output circuit adapted to output a clock signal based on an output signal of the first oscillation circuit, and an output control circuit adapted to perform output control of the clock signal output circuit, wherein the output control circuit includes a counter circuit adapted to perform a counting process based on an output signal of the second oscillation circuit, and the counter circuit outputs an output enable signal of the clock signal to the clock signal output circuit based on a result of the counting process.

According to the aspect of the invention, the output enable signal of the clock signal is output to the clock signal output circuit based on the result of the counting process based on the output signal of the second oscillation circuit. Since the output control of the clock signal is performed by the counter circuit as described above, it is possible to ensure the time until the appropriate oscillation state is achieved at the time of start-up of the oscillation circuit (the first oscillation circuit). Thus, even in the case in which the environmental variation, the process fluctuation, and so on occur, the appropriate clock signal can be output at the time of start-up of the oscillation circuit.

In the aspect of the invention, the output control circuit may include a count enable signal generation circuit adapted to generate a count enable signal of the counter circuit, and the counter circuit may start the counting process when the count enable signal turns to an active state.

According to the aspect of the invention with this configuration, it becomes possible to start the counting process at appropriate timing.

In the aspect of the invention, the second oscillation circuit may start an oscillation operation when the count enable signal turns to an active state, and then stop the oscillation operation when the output enable signal turns to the active state.

According to the aspect of the invention with this configuration, it is possible to perform the oscillation operation of the second oscillation circuit in an appropriate period, and it becomes possible to prevent the count missing from occurring, or to reduce the power consumption.

In the aspect of the invention, the count enable signal generation circuit may generate the count enable signal based on the output signal of the first oscillation circuit.

According to the aspect of the invention with this configuration, by generating the count enable signal based on the output signal of the first oscillation circuit, it is possible to start the counting process based on the output signal of the first oscillation circuit. Therefore, it is possible to start the counting process in the case in which the output signal (the oscillation state of the first oscillation circuit) of the first oscillation circuit fulfills the predetermined conditions, and it becomes possible to appropriately perform the counting process.

In the aspect of the invention, the counter circuit may start the counting process when the count enable signal turns to the active state, and then, set the output enable signal to the active state when a count value in the counting process reaches a given setting value.

According to the aspect of the invention with this configuration, the length of the period from when the count enable signal turns to the active state to when the output of the clock signal is started is controlled by counting the number of pulses of the output signal of the second oscillation circuit. Therefore, it is possible to ensure the time until the appropriate oscillation state is achieved at the time of start-up of the first oscillation circuit.

In the aspect of the invention, the second oscillation circuit may be a CR oscillation circuit.

According to the aspect of the invention with this configuration, it becomes possible to realize the second oscillation circuit using the CR oscillation circuit.

In the aspect of the invention, an oscillation frequency of the second oscillation circuit may be lower than an oscillation frequency of the first oscillation circuit.

According to the aspect of the invention with this configuration, it becomes possible to reduce the circuit scale of the counter circuit compared to the case of performing the counting process based on the output signal of the first oscillation circuit.

In the aspect of the invention, in a case in which the output control circuit is set to a duty correction mode, the output control circuit may output the output enable signal based on a result of the counting process to the clock signal output circuit, and in a case in which the output control circuit fails to be set to the duty correction mode, the output control circuit may fix the output enable signal to an active level.

According to the aspect of the invention with this configuration, it becomes possible to switch whether or not the output control of the clock signal using the second oscillation circuit and the counter circuit is performed by the mode setting.

In the aspect of the invention, defining a period from when a power supply voltage is applied to when an oscillation frequency of the first oscillation circuit is set in an allowable frequency deviation as T1, and defining a period from when the power supply voltage is applied to when the output enable signal turns to the active state as T2, T2<T1 may be true.

According to the aspect of the invention with this configuration, in the case of starting the output of the clock signal before the oscillation frequency of the first oscillation circuit becomes stable, it is possible to output the clock signal with the stable duty from the beginning of the output. Therefore, in the case in which the clock signal with the oscillation frequency not yet stabilized is used for some process, it becomes possible to prevent the error from occurring in that process.

In the aspect of the invention, the counter circuit may include a counter adapted to perform a counting operation based on the output signal of the second oscillation circuit, and an output circuit adapted to set the output enable signal to an inactive state in a case in which a reset signal is in the active state, and then set the output enable signal to the active state in a case in which the reset signal turns to an inactive state, and then an output signal of the counter turns to the active state.

According to the aspect of the invention with this configuration, when the reset signal is set to the inactive state, the first oscillation circuit is started up, then the count enable signal turns to the active state, the output signal of the counter is set to the active state, and the output enable signal is set to the active state by the output circuit. Thus, it is possible to operate the count enable signal generation circuit in the case in which the first oscillation circuit is started up, and then set the output enable signal to the active state after the time necessary for obtaining the clock signal with an appropriate duty has elapsed.

Another aspect of the invention relates to an oscillator including any one of the circuit devices described above, and an resonator.

Still another aspect of the invention relates to an electronic apparatus including the circuit device according to any one of the aspects of the invention described above.

Still another aspect of the invention relates to a vehicle including the circuit device according to any one of the aspects of the invention described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the measures for solving the problem of the invention.

1. Circuit Device

Figure 1:
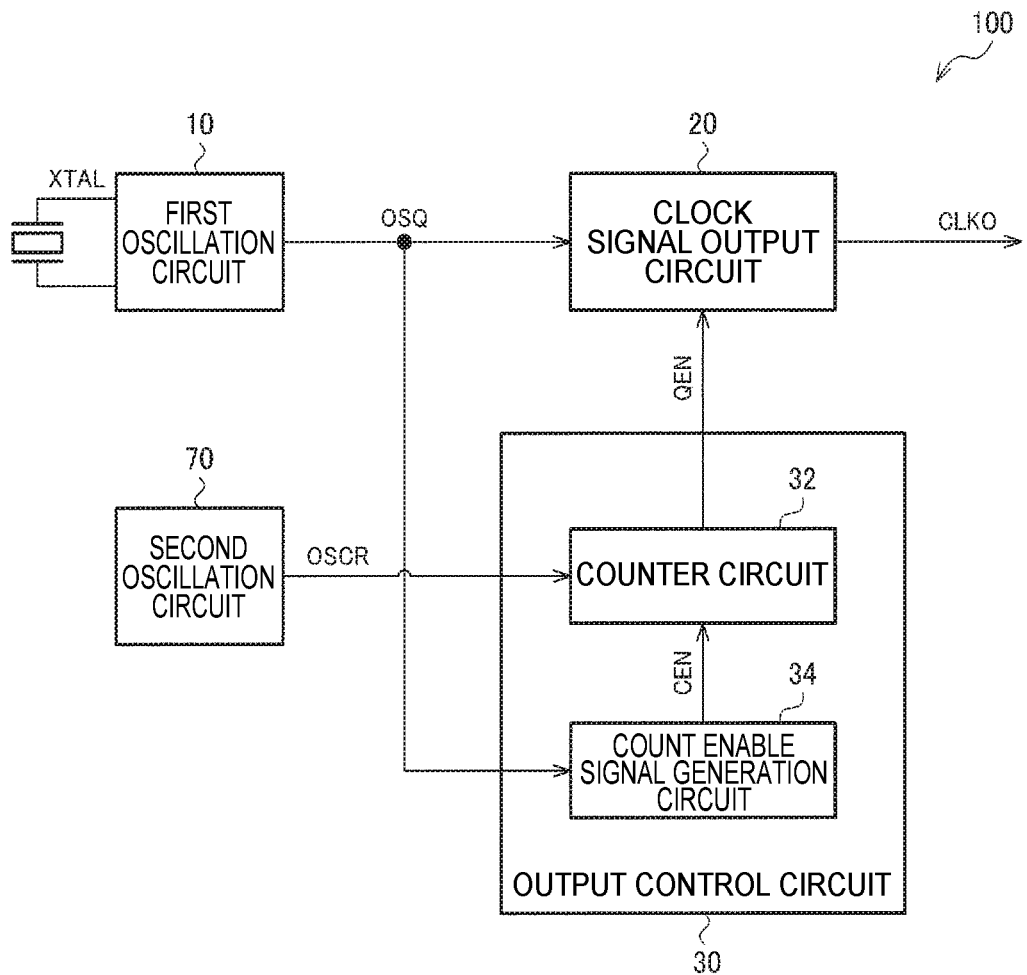
FIG. 1 is a diagram showing a configuration example of a circuit device according to an embodiment of the invention.

FIG. 1 shows a configuration example of a circuit device 100 according to the present embodiment. The circuit device 100 includes a first oscillation circuit 10, a second oscillation circuit 70, a clock signal output circuit 20 (an output buffer), and an output control circuit 30. The circuit device 100 is realized by, for example, an integrated circuit device (a semiconductor chip). Further, by housing the circuit device 100 and the resonator XTAL in a package, the oscillator is realized. It should be noted that the present embodiment is not limited to the configuration shown in FIG. 1, but there can be adopted a variety of practical modifications such as elimination of some of the constituents or addition of other constituents.

The first oscillation circuit 10 is a circuit for generating an oscillation signal using the resonator XTAL. Specifically, the first oscillation circuit 10 is connected to the resonator XTAL via first and second resonator terminals (resonator pads). Further, the first oscillation circuit 10 oscillates the resonator XTAL to thereby generate the oscillation signal. For example, in the TCXO and the OCXO, a control voltage (a voltage for compensating the temperature characteristics of the oscillation frequency) corresponding to the detected temperature is input to the first oscillation circuit 10, and the first oscillation circuit 10 oscillates the resonator XTAL at the oscillation frequency corresponding to the control voltage. Alternatively, in the SPXO, the resonator XTAL is oscillated at the natural vibration frequency of the resonator XTAL without performing the voltage control of the oscillation frequency. For example, the first oscillation circuit 10 includes an oscillation section (the oscillation circuit main body) for generating the oscillation signal, a buffer for buffering the oscillation signal to output an output signal OSQ.

The resonator XTAL is, for example, a piezoelectric resonator. Specifically, the resonator XTAL is, for example, a quartz crystal resonator. As the quartz crystal resonator, there can be cited a quartz crystal resonator vibrating in a thickness-shear mode having the cutting angle of, for example, AT-cut or SC-cut. For example, the resonator XTAL can also be a resonator incorporated in an oven-controlled crystal oscillator (OCXO) provided with a thermostatic oven, a resonator incorporated in a temperature compensated crystal oscillator (TCXO) not provided with a thermostatic oven, a resonator incorporated in a simple package crystal oscillator (SPXO), or the like. Further, as the resonator, it is also possible to adopt a surface acoustic wave (SAW) resonator, an MEMS (micro electro-mechanical systems) resonator as a silicon resonator formed using a silicon substrate, and so on. As a substrate material of the resonator XTAL, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the resonator XTAL, there can be used a device using a piezoelectric effect, or electrostatic drive using a coulomb force.

The second oscillation circuit 70 is a circuit which performs the oscillation operation at an oscillation frequency lower than the oscillation frequency of the first oscillation circuit 10 to output an output signal OSCR. In other words, the oscillation frequency of the second oscillation circuit is lower than the oscillation frequency of the first oscillation circuit 10. The second oscillation circuit 70 can also be a CR oscillation circuit. In the case of an example of using a quartz crystal resonator as the resonator XTAL, the oscillation frequency of the first oscillation circuit 10 is around several tens of mega hertz, on the one hand, and the oscillation frequency of the second oscillation circuit 70 (the CR oscillation circuit) is around several hundreds of kilometer, on the other hand. It should be noted that the oscillation frequencies of the first oscillation circuit 10 and the second oscillation circuit 70 can be implemented with a variety of modifications.

The clock signal output circuit 20 outputs a clock signal CLKO based on an output signal OSQ of the first oscillation circuit 10. Specifically, the clock signal output circuit 20 buffers (performs amplification for driving an external load) the output signal OSQ or the signal obtained by frequency-dividing the output signal OSQ, and then outputs the signal thus buffered as the clock signal CLKO. For example, the clock signal output circuit 20 includes a selection circuit for selecting either one of the output signal OSQ and the frequency-divided signal thereof, and a buffer for buffering the output of the selection circuit. It should be noted that the selection circuit can be omitted. The buffer outputs the clock signal CLKO shaped like, for example, a clipped sine wave, or in the CMOS signal level. The signal shaped like the clipped sine wave is a signal obtained by clipping the upper level and the lower level of a sine wave at predetermined voltage levels (e.g., power supply voltage levels).

The output control circuit 30 performs output control of the clock signal output circuit 20. Specifically, the output control circuit 30 controls whether the clock signal CLKO is set to an output state (active state) or set to a non-output state (inactive state). In the non-output state, it is possible for the clock signal output circuit 20 to output the clock signal CLKO at, for example, a fixed voltage level, or to set an output node (a node from which the clock signal CLKO is output) to a high-impedance state.

The output control circuit 30 has a counter circuit 32 for performing a counting process based on the output signal OSCR of the second oscillation circuit 70, and a count enable signal generation circuit 34 for generating a count enable signal CEN of the counter circuit 32 based on the output signal OSQ of the first oscillation circuit 10. Further, the counter circuit 32 starts the counting process when the count enable signal CEN is set to the active state, and then outputs an output enable signal QEN of the clock signal CLKO to the clock signal output circuit 20 based on the result of the counting process. Specifically, the count enable signal generation circuit 34 monitors the transitional oscillation state at the time of start-up of the first oscillation circuit 10, and in the case in which the monitor result fulfills a predetermined condition (a condition in which it can be determined that the oscillation has grown), the count enable signal generation circuit 34 activates the count enable signal CEN. The counting process performed by the counter circuit 32 can include a counting action (count-up or count-down of the count value) by the counter, and other signal processing (digital signal processing). For example, the counter circuit 32 performs the counting action, and a process of outputting the output enable signal QEN based on the count value. Further, in the case in which the output enable signal QEN has been set to the active state, the clock signal output circuit 20 outputs (sets the clock signal CLKO to the output state) the clock signal CLKO based on the output signal OSQ. It should be noted that the counter circuit 32 can be included in a control circuit (e.g., a control circuit 130 shown in FIG. 17) of the circuit device 100.

Figure 2:
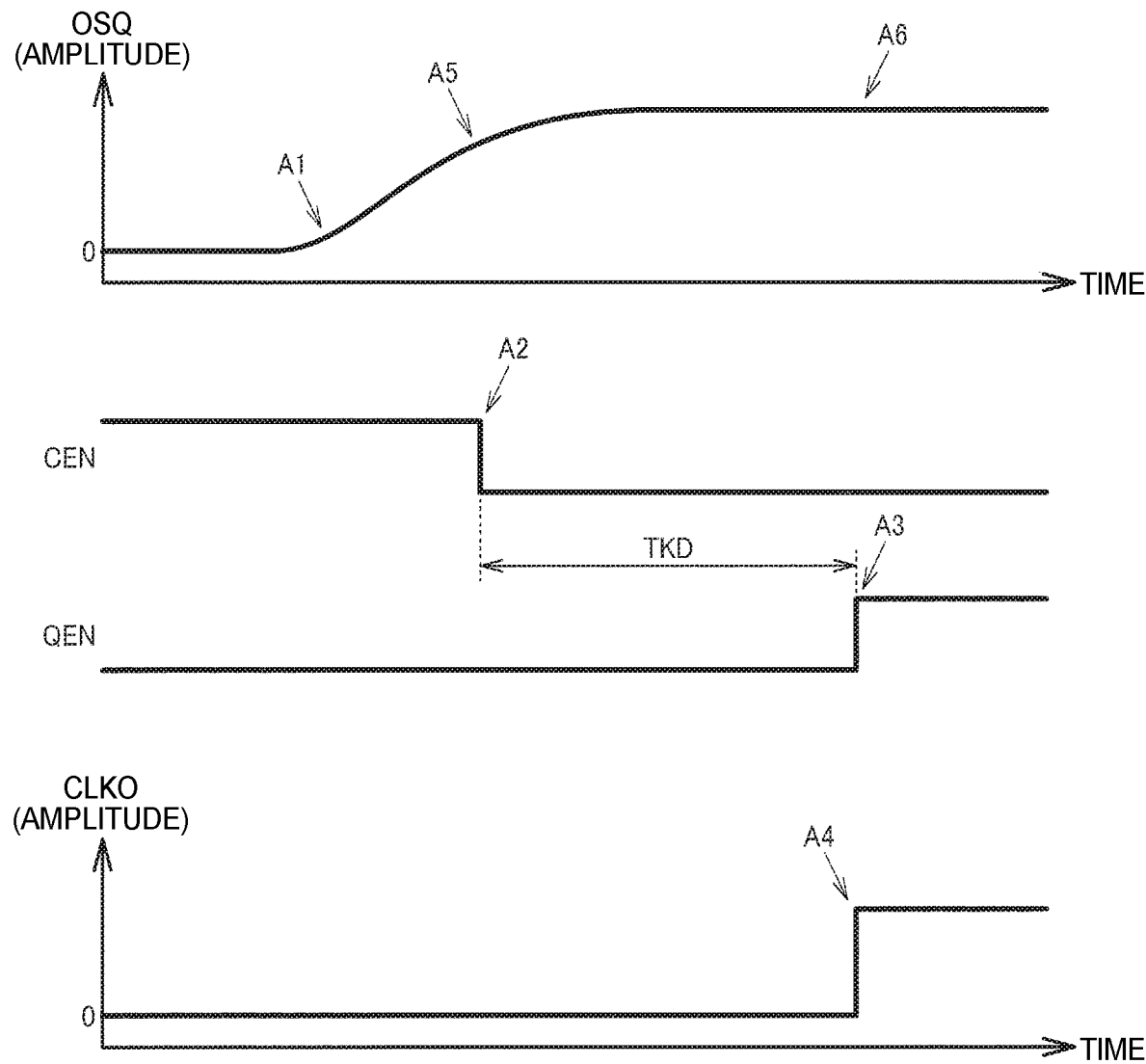
FIG. 2 is a waveform chart for describing an operation of the circuit device according to the embodiment.

FIG. 2 is a waveform chart for explaining the operation of the circuit device 100 according to the present embodiment. In FIG. 2, the waveforms of the output signal OSQ and the clock signal CLKO are shown with the waveforms having the voltage amplitudes (peak-to-peak voltages) of the respective signals.

As shown in the part A1 of FIG. 2, when the first oscillation circuit 10 starts driving the resonator XTAL, the amplitude of the oscillation signal gradually increases, and the amplitude of the output signal OSQ obtained by buffering the oscillation signal also gradually increases. As indicated by A2, when the amplitude of the output signal OSQ reaches a predetermined level, the count enable signal CEN changes from the inactive state (e.g., a high level, a first logic level) to an active state (a low level, a second logic level). When the count enable signal CEN is set to the active state, the counting process by the counter circuit 32 is performed. Thus, as indicated by A3, the output enable signal QEN changes from the inactive state (e.g., the low level, the second logic level) to the active state (the high level, the first logic level) when a period TKD has elapsed after the count enable signal CEN has been set to the active state. This period TKD is a period having a given length provided by the counting process. When the output enable signal QEN is set to the active state, as indicated by A4, the clock signal CLKO is output.

Figure 3:
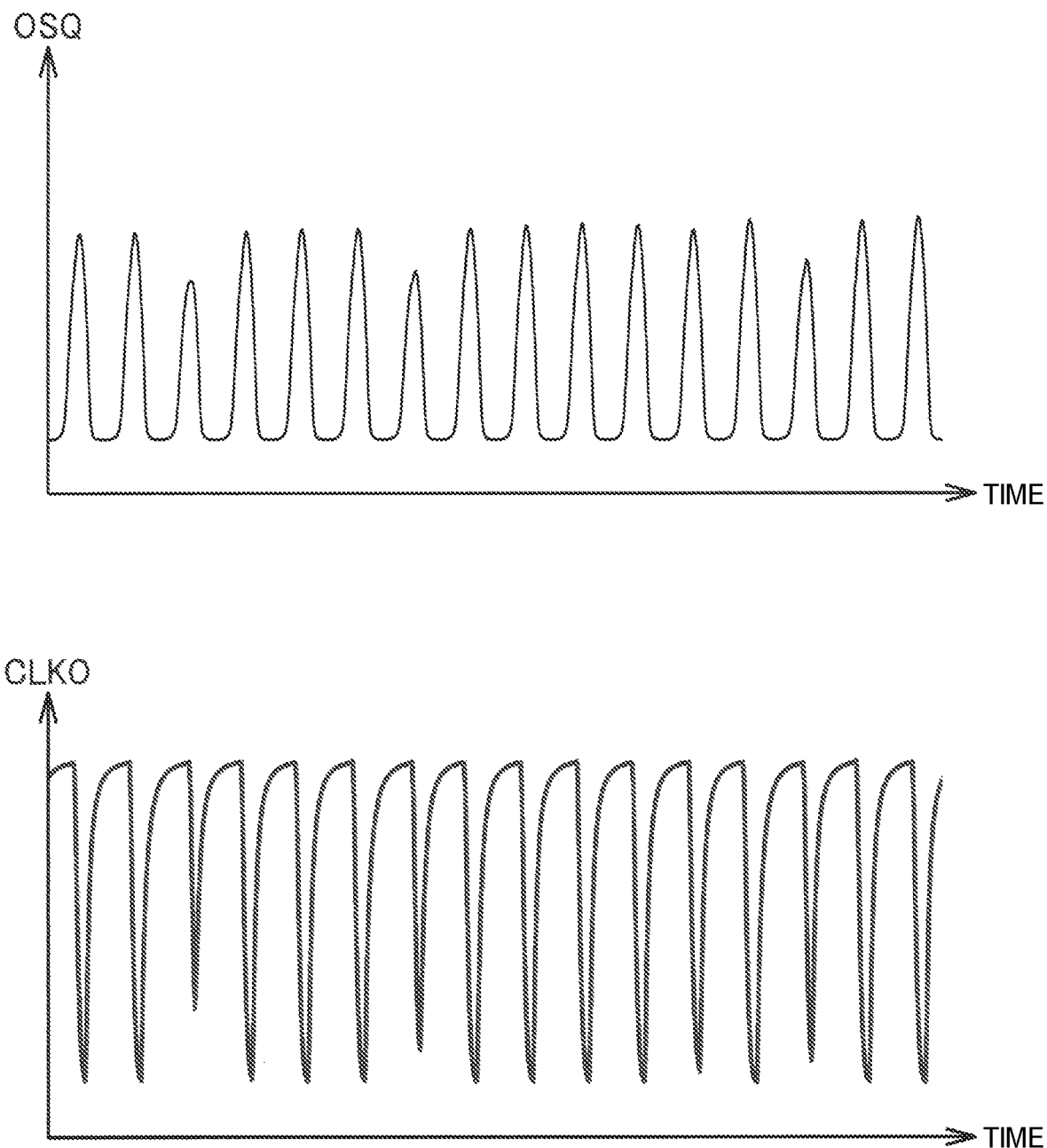
FIG. 3 is a diagram showing a comparative example of waveforms of an output signal and a clock signal of a first oscillation circuit.

FIG. 3 is a diagram showing a comparative example of the waveforms of the output signal OSQ and the clock signal CLKO of the first oscillation circuit 10. FIG. 3 shows the waveforms in the start-up process of the first oscillation circuit 10 as indicated by, for example, A5 in FIG. 2. Although in the present embodiment, output of the clock signal CLKO is not actually started, it is assumed here that the clock signal CLKO is output as a comparative example.

In the process of the start-up of the first oscillation circuit 10, since the amplitude of the oscillation signal is on the way of gradually increasing (has not yet reached the maximum amplitude), the output signal OSQ becomes a signal shaped like a pulse narrower in high-width compared to the low-width. The height of the pulse gradually increases as the oscillation amplitude increases. The clock signal CLKO obtained by buffering such an output signal OSQ becomes to have the duty significantly shifted from 50%, reflecting the duty of the output signal OSQ. Here, the duty denotes the high-width (the length of the high-level period) with respect to the length of one cycle. In the example shown in FIG. 3, the logic level of the clock signal CLKO is what is obtained by inverting the logic level of the output signal OSQ. In this case, since the duty of the output signal OSQ is significantly lower than 50%, the duty of the clock signal CLKO becomes significantly higher than 50%, accordingly.

In the control in the time of start-up of the related-art oscillation circuit, for example, the oscillation signal is integrated to obtain the integration voltage, and then, the output of the clock signal is started in the case in which the integration voltage becomes a predetermined voltage. In the control only with such an analog process, it is difficult to ensure a sufficient time period for the duty of the clock signal to settle around 50% (for the amplitude of the oscillation signal to reach the maximum amplitude). Therefore, there is a possibility that the output of the clock signal is started in the state in which the duty is significantly shifted from 50% as shown in FIG. 3. Further, since the analog process is apt to be affected by the temperature variation or the process fluctuation, the duty at the time point when the output of the clock signal is started is varied, and it becomes difficult to set the duty within the range of the specifications. For example, there is a possibility that the time until the condition that the integration voltage described above reaches the predetermined voltage is satisfied varies under the influence of the temperature variation, the process fluctuation, and so on, and as a result, the duty of the clock signal varies.

Figure 4:
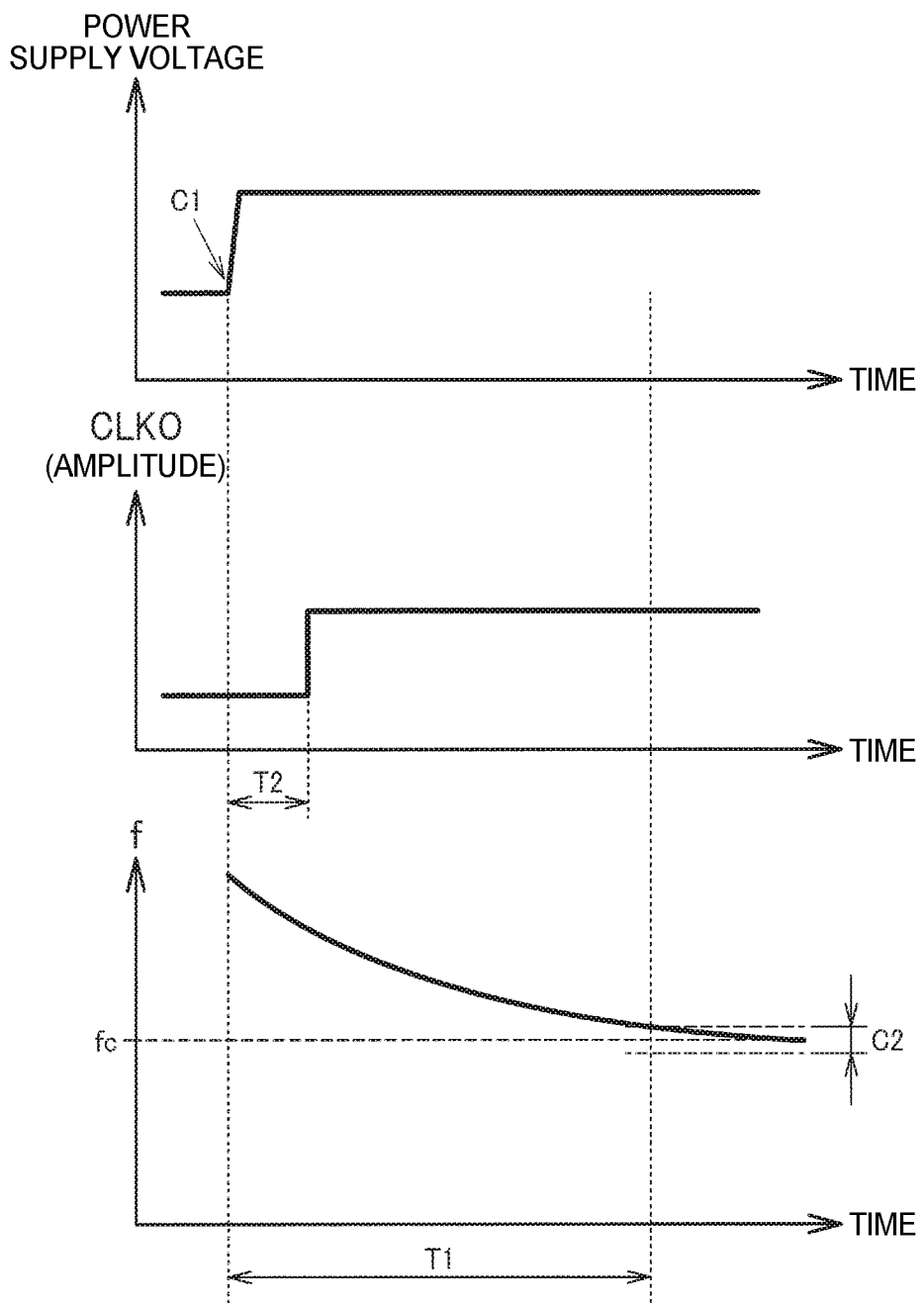
FIG. 4 is a diagram showing an example of a temporal change of the amplitude and the frequency of the clock signal after a power supply starts up.

FIG. 4 is a diagram for describing the temporal changes of the power supply voltage in the start-up period of the circuit device 100 according to the present embodiment, the voltage amplitude of the clock signal CLKO, and the oscillation frequency f of the first oscillation circuit 10. The reference symbol C1 in FIG. 4 represents the power-ON timing, and thus, the first oscillation circuit 10 starts driving the resonator XTAL. The oscillation frequency f of the first oscillation circuit 10 includes an error with respect to a desired value (a standard value, a reference value) fc immediately after starting the drive, and then converges with fc with the passage of time. Here, the clock signal CLKO high in frequency accuracy becomes necessary in a posterior IC (e.g., a processing section 520 in FIG. 20) in some cases. For example, in the case in which the posterior IC is an IC (an RFIC constituting an RF section in a restricted sense) included in a GPS receiver, the clock signal CLKO is used for the demodulation of the signal received by the GPS antenna, and is therefore required to be high in frequency accuracy. Therefore, the circuit device 100 is configured so as to fulfill the requirement that the oscillation frequency of the first oscillation circuit 10 settles within an allowable frequency deviation (C2) in a predetermined period T1 from the start-up of the power supply (from the application of the power supply voltage). The period T1 here differs in accordance with the situation, but is a period of, for example, around several milliseconds. Further, although the allowable frequency deviation also differs in accordance with the situation, but is a variation of, for example, around several parts per million.

The period T1 is longer than the period from the start-up of the power supply to when the amplitude of the output signal OSQ becomes sufficiently high (A2, A5 in FIG. 2). Therefore, the circuit device 100 is capable of outputting the clock signal CLKO to the posterior IC even in the state in which the oscillation frequency is not set in the allowable frequency deviation. The posterior IC starts the main process such as reception of the GPS signal after the oscillation frequency comes sufficiently close to the desired value fc (after the period T1 elapses). If the posterior IC does not perform the process using the clock signal CLKO at timing before the period T1 elapses, no significant problem occurs even if a duty variation of the clock signal described using FIG. 3 occurs.

However, it is conceivable to perform preprocessing before starting the main process depending on the posterior IC. In the preprocessing, there occurs no problem if the frequency accuracy of the clock signal is low compared to the main process such as the reception of the GPS signal. Therefore, for example, the posterior IC starts the preprocessing in accordance with the start of the output of the clock signal CLKO from the circuit device 100, and makes the transition to the main process after the period T1 elapses. In such an example, the duty variation of the clock signal shown in FIG. 3 becomes a problem. For example, due to the factor that the pulse width of the clock signal is too narrow to succeed in the clock detection, or the factor that the clock detection timing does not become appropriate in the case of performing the process using both of the rising edge and the falling edge, there is a possibility that an error occurs in the preprocessing of the posterior IC.

In this regard, according to the present embodiment, in the case in which the count enable signal CEN from the count enable signal generation circuit 34 turns to the active state, the counting process is performed by the counter circuit 32. Then, in the case in which the output enable signal QEN is set to the active state based on the counting process, the clock signal output circuit 20 outputs the clock signal CLKO. Thus, it becomes possible to ensure sufficient time for the duty (the amplitude of the oscillation signal) of the clock signal to settle around 50%. In other words, the count enable signal CEN turns to the active state at the time point when it is determined that the oscillation has grown at the time of start-up of the first oscillation circuit 10, and then the output of the clock signal CLKO can be started after the period TKD elapses due to the subsequent counting process. Due to the period TKD, there is ensured the sufficient time for the duty in the time of starting the output of the clock signal CLKO to settle in the vicinity of 50%. Further, although generation of the count enable signal CEN is realized by, for example, an analog process, by further combining the counting process (the digital process), the influences of the temperature variation, the process fluctuation, and so on can be reduced. In other words, it becomes possible to reduce the variation in the duty due to these influences to set the variation within the range of the specifications.

It should be noted that the time until the duty of the clock signal settles around 50% is sufficiently short compared to the period T1 described above, and it is sufficient to provide the time of, for example, about several hundreds of microsecond even if a margin is included. In other words, it can be said that T2<T1 is true defining T2 as the period from when the power supply voltage is applied to when the output enable signal QEN turns to the active state. It should be noted that regarding T2, it is sufficient to consider the sum of the length of the period from when the power supply has started up to when CEN becomes active, and the length of the period TKD.

Figure 5:
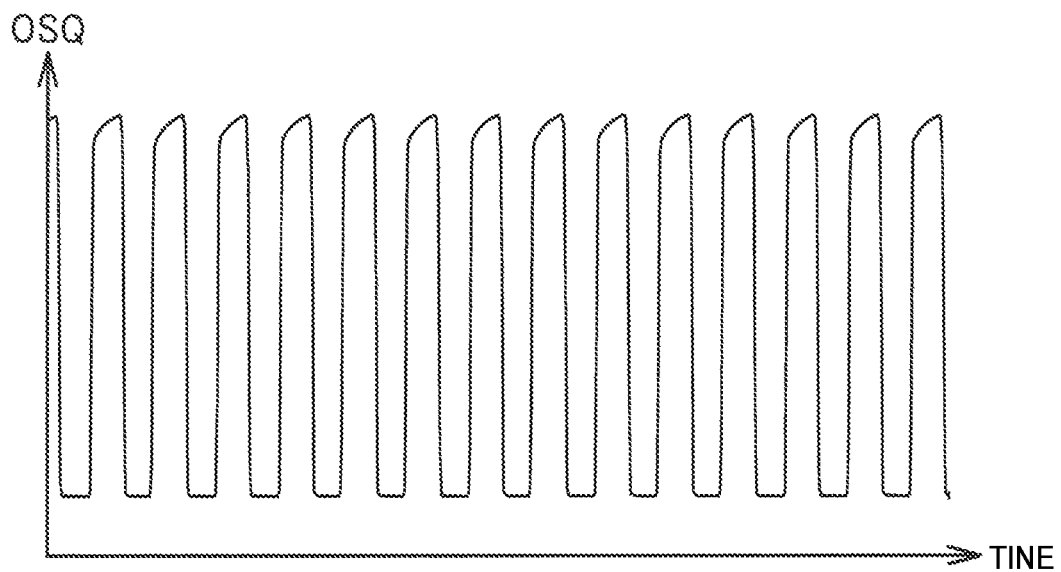
FIG. 5 is a diagram showing an example of waveforms of the output signal and the clock signal of the first oscillation circuit in the embodiment.
Figure 5:
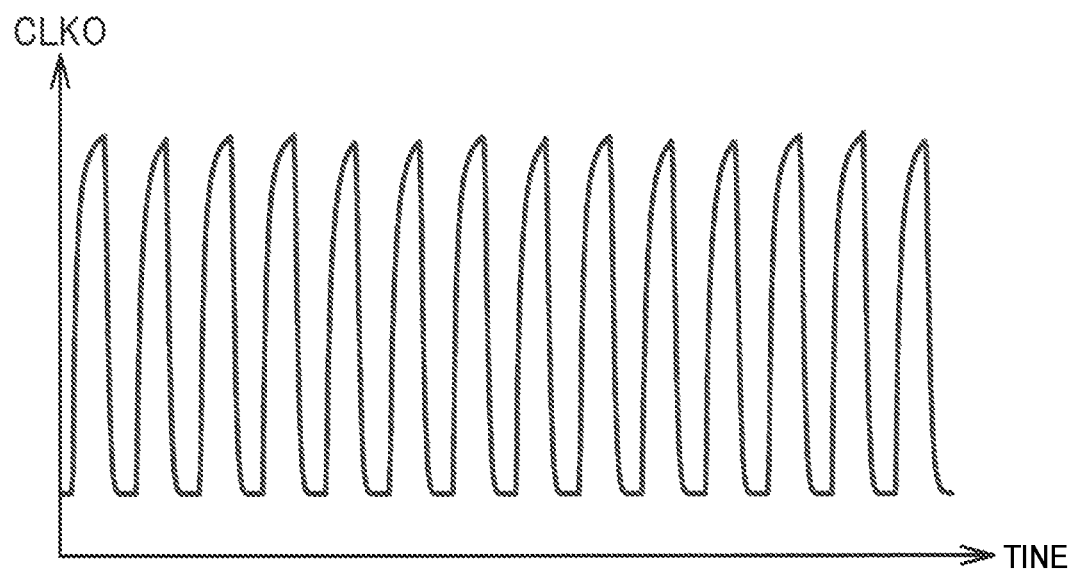

FIG. 5 shows an example of the waveforms of the output signal OSQ and the clock signal CLKO of the first oscillation circuit 10 in the present embodiment. FIG. 5 shows the waveforms at the time point when the oscillation is sufficiently stabilized after the start-up of the first oscillation circuit 10 as indicated by, for example, A6 in FIG. 2.

When sufficient time elapses (e.g., the oscillation amplitude reaches the maximum amplitude) after the first oscillation circuit 10 has started up, the low-width and the high-width of the output signal OSQ of the first oscillation circuit 10 become in roughly the same level, and the duty of the output signal OSQ becomes around 50%. The clock signal CLKO obtained by buffering such an output signal OSQ becomes to have the duty around 50%, reflecting the duty of the output signal OSQ.

In the present embodiment, there is set in advance the length of the period TKD with which the duty around 50% (or in the range fulfilling the specifications) can be obtained at the time of starting the output of the clock signal CLKO taking the influences of the temperature variation, the process fluctuation, and so on into consideration. In particular, in the present embodiment, the period TKD is set by counting the output signal OSCR of the second oscillation circuit 70 relatively lower in oscillation frequency. Therefore, even in the case of using the counter circuit 32 having a relatively simple configuration, it becomes possible to increase the length of the period TKD to some extent, namely to provide a sufficient margin. Therefore, even if there exist the influences of the temperature variation, the process fluctuation, and so on, it is possible to output the clock signal with an appropriate duty at the time of starting the output of the clock signal CLKO.

As described above, compared to the case of performing the control at the time of start-up only with the analog process, by combining the counting process, the appropriate clock signal CLKO is realized. In contrast, there is considered the case of performing the output control of the clock signal CLKO only with the counter circuit 32. Since the counter circuit 32 performs the counting process using the output signal OSCR of the second oscillation circuit 70 different from the first oscillation circuit 10, in this case, the start timing of the counting process and the condition of the output signal OSQ of the first oscillation circuit 10 do not correspond to each other, and there is a possibility that the counting process is not appropriately performed. If the counting process is not appropriately performed, the timing at which the output enable signal QEN is set to the active state fails to become what is obtained taking the condition of the output signal OSQ into consideration, and it becomes impossible to realize the accurate control.

In this regard, according to the present embodiment, a count enable signal generation circuit 34 generates the count enable signal CEN. Thus, since the counting process is started after the count enable signal CEN is set to the active state, it becomes possible to start the counting process after the condition in which the counting process is appropriately performed is realized. Thus, the timing at which the output enable signal QEN is set to the active state becomes appropriate, and the accurate control can be realized.

More specifically, the count enable signal generation circuit 34 generates the count enable signal CEN based on the output signal OSQ of the first oscillation circuit 10.

Figure 6:
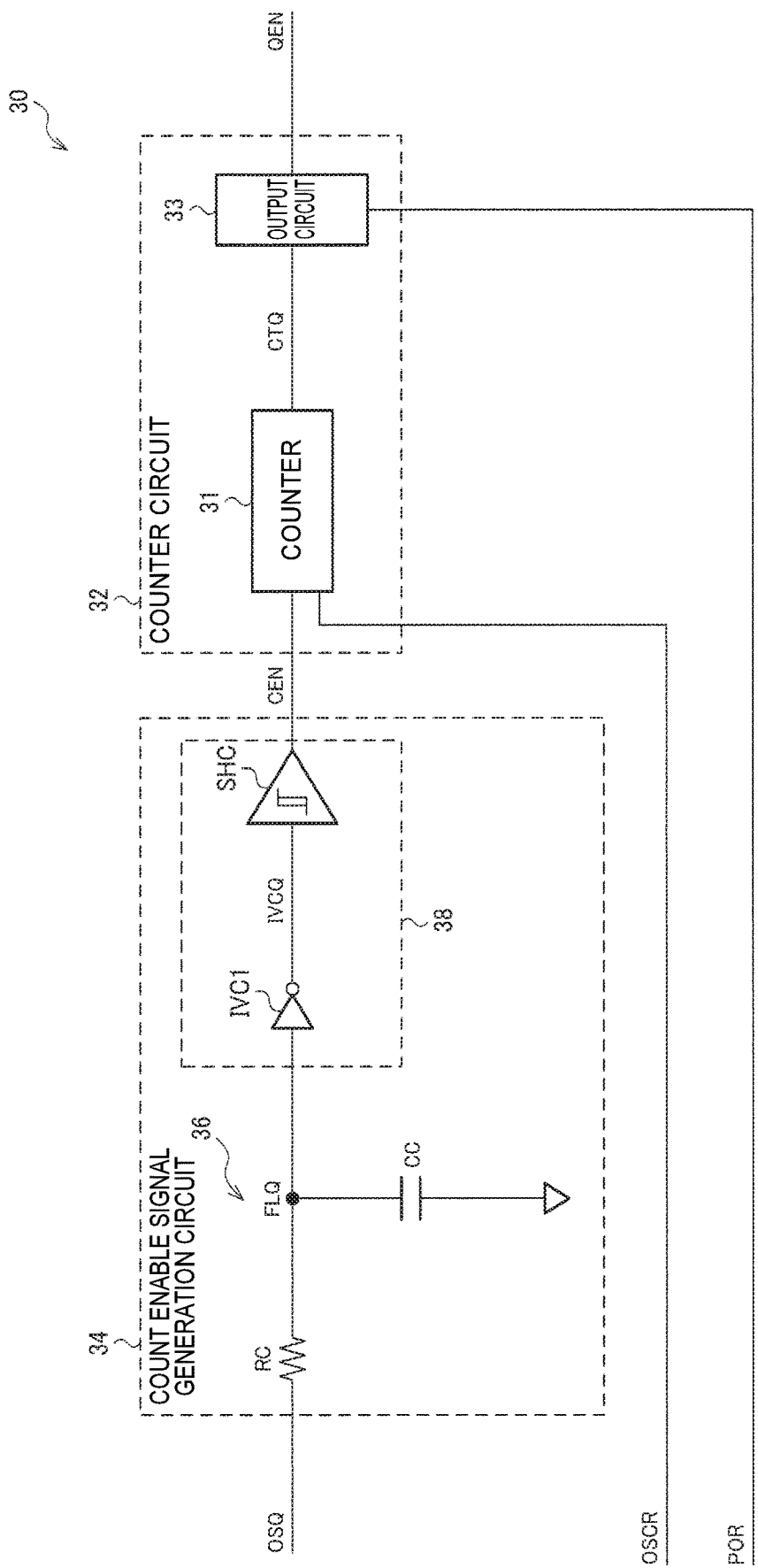
FIG. 6 is a diagram showing a first detailed configuration example of an output control circuit.

As described later with reference to FIG. 6 and so on, it is also possible for the count enable signal generation circuit 34 to include an analog circuit (e.g., a filter) for performing analog processing on the output signal OSQ, and a determination section (e.g., a logic inverting circuit, and a schmitt trigger circuit) for determining whether or not the count enable signal CEN is to be set to the active state based on the output of the analog circuit.

By generating the count enable signal CEN using, for example, the analog processing based on the output signal OSQ of the first oscillation circuit 10 as described above, it is possible to start the counting process based on the output signal OSQ. Therefore, it is possible to start the counting process in the case in which the output signal OSQ fulfills a predetermined condition (e.g., the case in which the output of the analog circuit becomes a predetermined signal level). Thus, it is possible to start the counting process using the output signal OSCR of the second oscillation circuit 70 at the timing corresponding to the condition of the output signal OSQ, and thus, it becomes possible to appropriately perform the counting process.

Further, in the present embodiment, the counter circuit 32 starts the counting process when the count enable signal CEN is set to the active state. Then, the counter circuit 32 sets the output enable signal QEN to the active state when the count value in the counting process reaches a given setting value. Specifically, the length of the period TKD described above with reference to FIG. 2 is the length of the period from when starting counting the number of pulses of the output signal OSCR of the second oscillation circuit 70 to when the count value becomes the given setting value. For example, it is possible for the counter circuit 32 to include a linear feedback shift register, and output any one (e.g., the most significant bit) of the bits of the binary data (the count value) of the linear feedback shift register as the output enable signal QEN. Alternatively, it is also possible that the counter circuit 32 includes a counter and a determination section, and the determination section compares the count value from the counter and the given setting value with each other, and then sets the output enable signal QEN to the active state in the case in which it is determined that the count value and the given setting value have coincided with each other.

According to this process, the period TKD from when the count enable signal CEN is set to the active state to when the output of the clock signal CLKO is started is controlled by counting the number of pulses of the output signal OSCR (the oscillation signal). The oscillation frequency of the second oscillation circuit 70 is low compared to the oscillation frequency of the first oscillation circuit 10, and in the order of, for example, about 1/100. Therefore, in the case of the comparison with the example of counting the output signal OSQ of the first oscillation circuit 10, even if the setting value is made smaller, it becomes possible to ensure the length of the period TKD. In other words, it is possible to make the circuit scale of the counter circuit 32 (a counter 31) relatively small.

It should be noted that the given setting value can be determined by hardware (e.g., the example of the linear feedback shift register described above), or can also be set by the register setting. Alternatively, it is also possible that the given setting value is set in accordance with the information written to a nonvolatile memory in the manufacturing process or the like. Alternatively, it is also possible that the given setting value is generated inside the circuit device 100 (e.g., an example using a temperature sensor described later).

2. First Detailed Configuration Example of Output Control Circuit

The details of the constituents of the circuit device 100 will hereinafter be described. FIG. 6 shows a first detailed configuration example of the output control circuit 30. In FIG. 6, the count enable signal generation circuit 34 includes a smoothing circuit 36 (a smoothing filter) and a detection circuit 38. The counter circuit 32 includes the counter 31 and an output circuit 33. It should be noted that the present embodiment is not limited to the configuration shown in FIG. 6, but there can be adopted a variety of practical modifications such as elimination of some of the constituents or addition of other constituents.

Firstly, the count enable signal generation circuit 34 will be described. The smoothing circuit 36 smoothes the output signal OSQ of the first oscillation circuit 10, and then outputs the signal obtained by smoothing the output signal OSQ as an output signal FLQ. Specifically, the smoothing circuit 36 decreases the component around the oscillation frequency of the first oscillation circuit 10 from the output signal OSQ to thereby output a DC-like signal (in a sufficiently low band compared to the oscillation frequency). For example, the smoothing circuit 36 is a low-pass filter having a cutoff frequency sufficiently lower (e.g., ⅕ or lower) than the oscillation frequency. In the example shown in FIG. 6, the smoothing circuit 36 is a first-order passive low-pass filter including a resistor element RC and a capacitor CC. It should be noted that the smoothing circuit 36 is not limited thereto, but can also be a second or higher order filter, or an active filter.

By smoothing the output signal OSQ of the first oscillation circuit 10 to convert into the DC-like signal as described above, it becomes possible to monitor the oscillation state (the degree of the growth of the oscillation at the time of start-up) of the first oscillation circuit 10. Specifically, since the voltage level (the signal level) of the output signal FLQ of the smoothing circuit 36 varies in accordance with the oscillation amplitude, it is possible to use the voltage level as the monitor signal.

The detection circuit 38 performs the detection operation based on the output signal FLQ of the smoothing circuit 36 to output the count enable signal CEN. Therefore, the detection circuit 38 performs the detection operation of the voltage level of the output signal FLQ based on the output signal FLQ to monitor the degree of the growth of the oscillation. Then, the detection circuit 38 generates the count enable signal CEN based on the detection result.

As described above, the voltage level of the output signal FLQ of the smoothing circuit 36 varies with the oscillation amplitude. Therefore, by performing the detection operation based on the output signal FLQ, it is possible to detect the fact that the oscillation amplitude with which the counting process can be started has been reached, and it becomes possible to set the count enable signal CEN to the active state based on the detection result.

Specifically, the detection circuit 38 sets the count enable signal CEN to the active state in the case in which the voltage level of the output signal FLQ of the smoothing circuit 36 has exceeded the given voltage level. For example, the given voltage level is higher than ½ (preferably ⅔, and more preferably ¾) of the voltage level of the output signal FLQ corresponding to the maximum oscillation amplitude.

The larger the amplitude of the output signal OSQ by growth of the oscillation of the first oscillation circuit 10 becomes, the higher the voltage level of the output signal FLQ of the smoothing circuit 36 becomes. Therefore, by detecting the fact that the voltage level of the output signal FLQ has exceeded the given voltage level, it is possible to set the count enable signal CEN to the active state in the case in which the oscillation has grown to the desired oscillation amplitude.

The detection circuit 38 includes a logic inverting circuit IVC1, and a schmitt trigger circuit SHC. To the logic inverting circuit IVC1, there is input the output signal FLQ of the smoothing circuit 36. For example, the logic inverting circuit IVC1 is an inverter, but is not limited thereto, and can also be a NAND circuit (in the case in which one of the inputs is "1"), a NOR circuit (in the case in which one of the inputs is "0"), and so on. To the schmitt trigger circuit SHC, there is input the output signal IVCQ of the logic inverting circuit IVC1, and the schmitt trigger circuit SHC outputs the count enable signal CEN.

According to this process, when the voltage level of the output signal FLQ of the smoothing circuit 36 has exceeded the logical threshold value of the logic inverting circuit IVC1, the logic level of the output signal IVCQ of the logic inverting circuit IVC1 changes from the high level to the low level. Therefore, by inputting the output signal FLQ of the smoothing circuit 36 to the logic inverting circuit IVC1, it is possible to determine whether or not the voltage level of the output signal FLQ has exceeded the given voltage level (the logical threshold value).

Further, there is a possibility that in the output signal FLQ of the smoothing circuit 36, there remains the component of the oscillation frequency, or there is included the noise. In such a case, there is a possibility that the change in the output signal IVCQ of the logic inverting circuit IVC1 fails to cause a single edge (the logic level flutters, in other words, the logic level of the output signal IVCQ repeats taking the high level and the low level around the logical threshold value). In this regard, in the present embodiment, by using the schmitt trigger circuit SHC, it is possible to appropriately change the count enable signal CEN from the high level (the inactive state) to the low level (the active state).

It should be noted that the drive capability of the logic inverting circuit IVC1 is set to an extremely low level. In other words, the logic inverting circuit IVC1 is constituted by a transistor small in size (W/L). Specifically, the logic inverting circuit IVC1 is set to have the drive capability with which the oscillation frequency component can be reduced, and is arranged so that the oscillation frequency component included in the output signal FLQ of the smoothing circuit 36 can be reduced. Thus, it is possible to reduce the fluttering of the logic level of the output signal IVCQ of the logic inverting circuit IVC1.

Then, the counter circuit 32 will be described. The counter 31 of the counter circuit 32 performs the counting operation based on the output signal OSCR of the second oscillation circuit 70. Specifically, the counter 31 counts the number of pulses of the output signal OSCR. For example, the counter 31 is constituted by a simple shift register or a linear feedback shift register. Further, the counter 31 outputs the internal signal of either one of the shift register and the linear feedback shift register as an output signal CTQ. Alternatively, it is also possible that the counter 31 further includes a decoder, and the decoder decodes the count value to output the output signal CTQ. The output signal CTQ is a signal which changes from the inactive state (the high level, the first logic level) to the active state (the low level, the second logic level) in the case in which the count value becomes the given setting value.

The output circuit 33 sets the output enable signal QEN to the inactive state in the case in which a reset signal POR is in the active state (a reset state, e.g., the low level). The output circuit 33 sets the output enable signal QEN to the active state in the case in which the output signal CTQ of the counter 31 is set to the active state after the reset signal POR is set to the inactive state (a reset-release state, e.g., the high level). The reset signal POR is, for example, a power-on reset signal, a reset signal supplied from the outside (e.g., a CPU) of the circuit device 100, or a reset signal generated by the control circuit of the circuit device 100.

When the reset signal POR is set to the inactive state, the first oscillation circuit 10 is started up (starts the oscillation), then the count enable signal CEN is set to the active state, the output signal CTQ of the counter 31 is set to the active state, and the output enable signal QEN is set to the active state by the output circuit 33. Thus, it is possible to operate the count enable signal generation circuit 34 (only) in the case in which the first oscillation circuit 10 is started up, and then set the output enable signal QEN to the active state after the time necessary for obtaining the clock signal CLKO with an appropriate duty has elapsed.

The output circuit 33 is, for example, an RS latch (reset-set latch). Specifically, in the case in which the reset signal POR is in the active state, the RS latch is in the reset state, and the output enable signal QEN is kept in the inactive state. In contrast, when the reset signal POR is set to the inactive state, the reset state of the RS latch is released, and in the case in which the output signal CTQ of the counter 31 is in the inactive state, the output enable signal QEN is in the inactive state, and when the output signal CTQ changes to the active state, the RS latch performs the latch operation to set the output enable signal QEN to the active state.

By using the RS latch as described above, the operation of the output circuit 33 is realized. Specifically, it is possible to set the output enable signal QEN to the active state in the case in which the output signal CTQ of the counter 31 is set to the active state after the reset signal POR is set to the inactive state.

It should be noted that the output circuit 33 is not limited to the RS latch, but can also be a latch circuit for performing the latch operation based on, for example, the clock signal. In this case, it is also possible to perform the latch operation based on, for example, the output signal OSQ of the first oscillation circuit 10. Alternatively, it is also possible to adopt a processing circuit (a logic circuit) for performing certain signal processing on the output signal CTQ of the counter 31 to output the output enable signal QEN.

3. Second Detailed Configuration Example of Output Control Circuit

Figure 7:
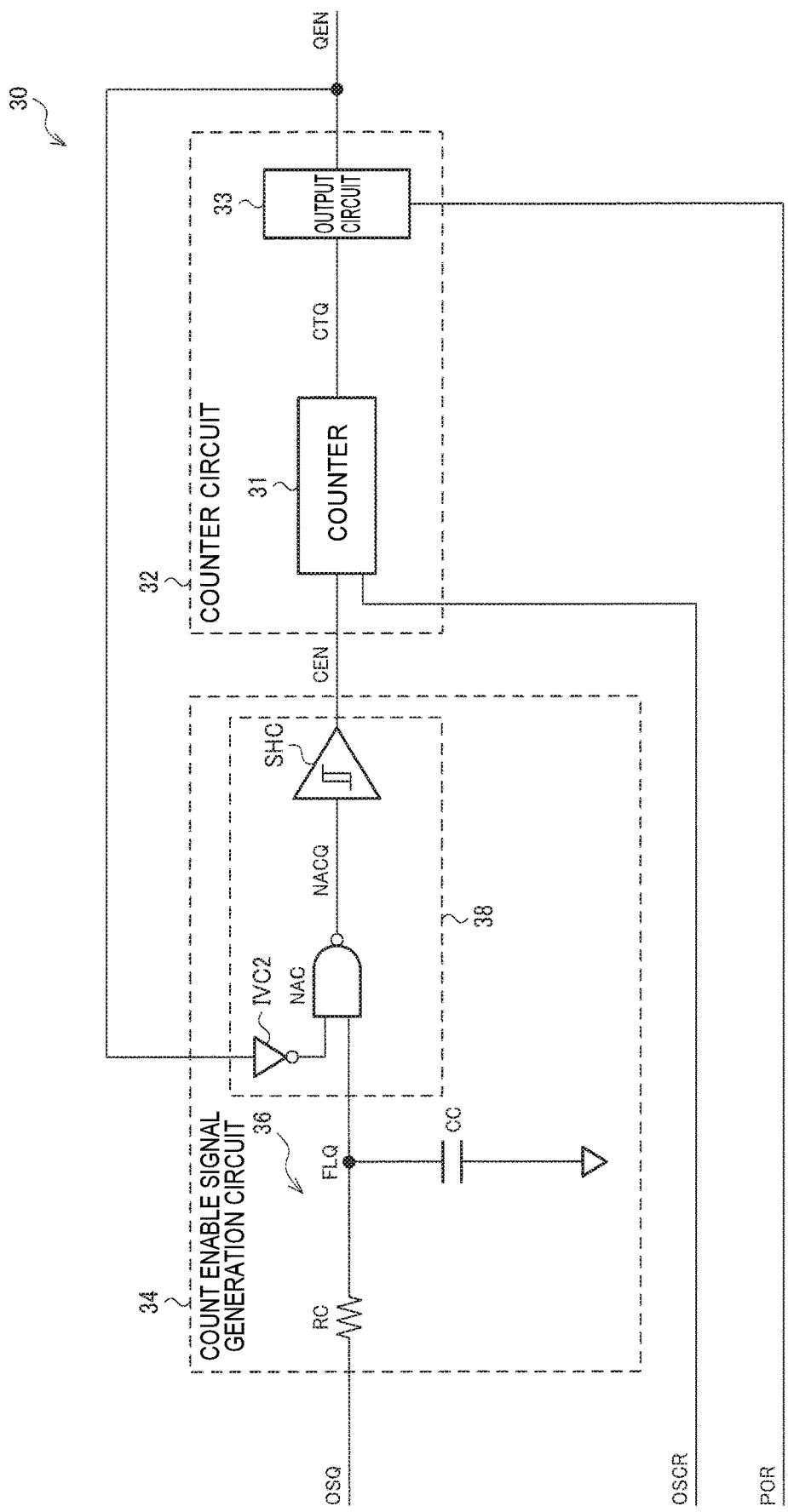
FIG. 7 is a diagram showing a second detailed configuration example of the output control circuit.

FIG. 7 shows a second detailed configuration example of the output control circuit 30. In FIG. 7, the detection circuit 38 of the count enable signal generation circuit 34 includes an inverter IVC2, a NAND circuit NAC (a negative AND circuit), and a schmitt trigger circuit SHC. It should be noted that the present embodiment is not limited to the configuration shown in FIG. 7, but there can be adopted a variety of practical modifications such as elimination of some of the constituents or addition of other constituents.

In the present embodiment, the detection circuit 38 sets the count enable signal CEN to the inactive state in the case in which the output enable signal QEN is set to the active state. Specifically, the output signal FLQ of the smoothing circuit 36, and a signal which is obtained by the inverter IVC2 logic-inverting the output enable signal QEN are input to the NAND circuit NAC, and the output signal NACQ of the NAND circuit NAC is input to the schmitt trigger circuit SHC.

According to this process, due to the feedback from the output enable signal QEN to the count enable signal CEN, in the case in which the output enable signal QEN changes from the inactive state to the active state, it is possible to disable the operation of the counter circuit 32 (the output control circuit 30). Once the output of the clock signal CLKO is started after the start-up of the first oscillation circuit 10, the output control of the clock signal CLKO is thereafter unnecessary. Therefore, it is possible to disable the operation of the counter circuit 32 as in the present embodiment. Further, by disabling the operation of the counter circuit 32, it is possible to reduce the wasteful power consumption to thereby reduce the power consumption of the circuit device 100.

Figure 8:
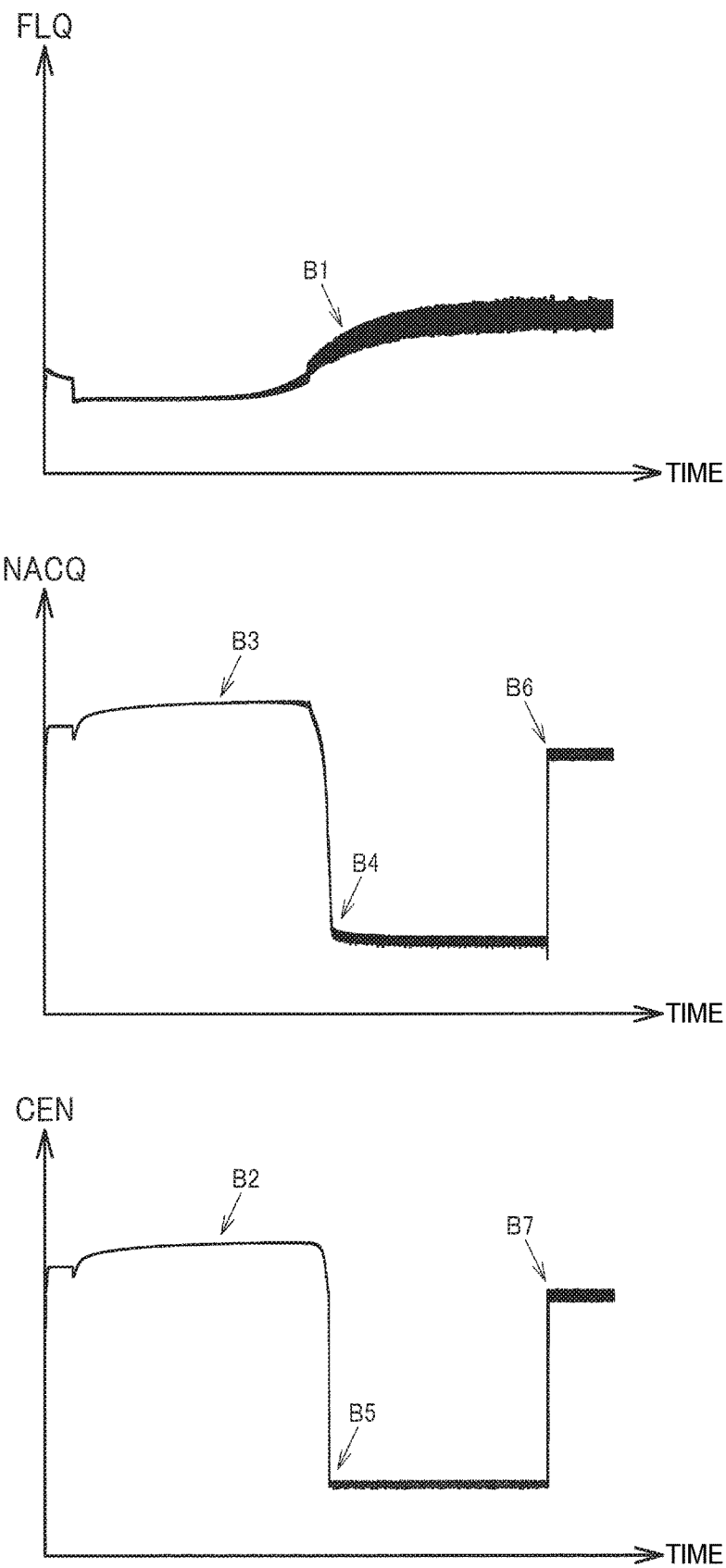
FIG. 8 is a diagram showing a waveform example for explaining an operation of the output control circuit of the second detailed configuration example.

FIG. 8 is a waveform example (a voltage waveform example) for explaining the operation of the output control circuit 30 shown in FIG. 7.

As indicated by B1 in FIG. 8, the voltage level of the output signal FLQ of the smoothing circuit 36 rises as the amplitude of the output signal OSQ of the first oscillation circuit 10 increases. The oscillation frequency component is attenuated by the smoothing circuit 36, but is partially transmitted, and therefore, the output signal FLQ vibrates at the oscillation frequency.

When the reset signal POR changes from the active state to the inactive state (when the first oscillation circuit 10 is started up), the output enable signal QEN is in the low level (in the inactive state). Since the voltage level of the output signal FLQ of the smoothing circuit 36 is the low level as the logic level until the voltage level exceeds the logical threshold value, the output signal NACQ of the NAND circuit NAC is in the high level as indicated by B3.

When the voltage level of the output signal FLQ of the smoothing circuit 36 exceeds the logical threshold value, the output signal NACQ of the NAND circuit NAC changes from the high level to the low level as indicated by B4. Although the oscillation frequency component remains in the output signal FLQ of the smoothing circuit 36, the NAND circuit NAC has been reduced in the drive capability, and therefore functions as a kind of low-pass filter to prevent the spike of the output signal NACQ from occurring. When the output signal NACQ of the NAND circuit NAC changes from the high level to the low level, the count enable signal CEN as the output signal of the schmitt trigger circuit SHC changes from the high level (the inactive state) to the low level (the active state) as indicated by B5.

When the count value of the counter 31 reaches the given setting value, and the output enable signal QEN changes from the low level (the inactive state) to the high level (the active state), the output signal NACQ of the NAND circuit NAC changes from the low level to the high level as indicated by B6. Thus, the count enable signal CEN changes from the low level (the active state) to the high level (the inactive state) as indicated by B7.

4. Counter

Figure 9:
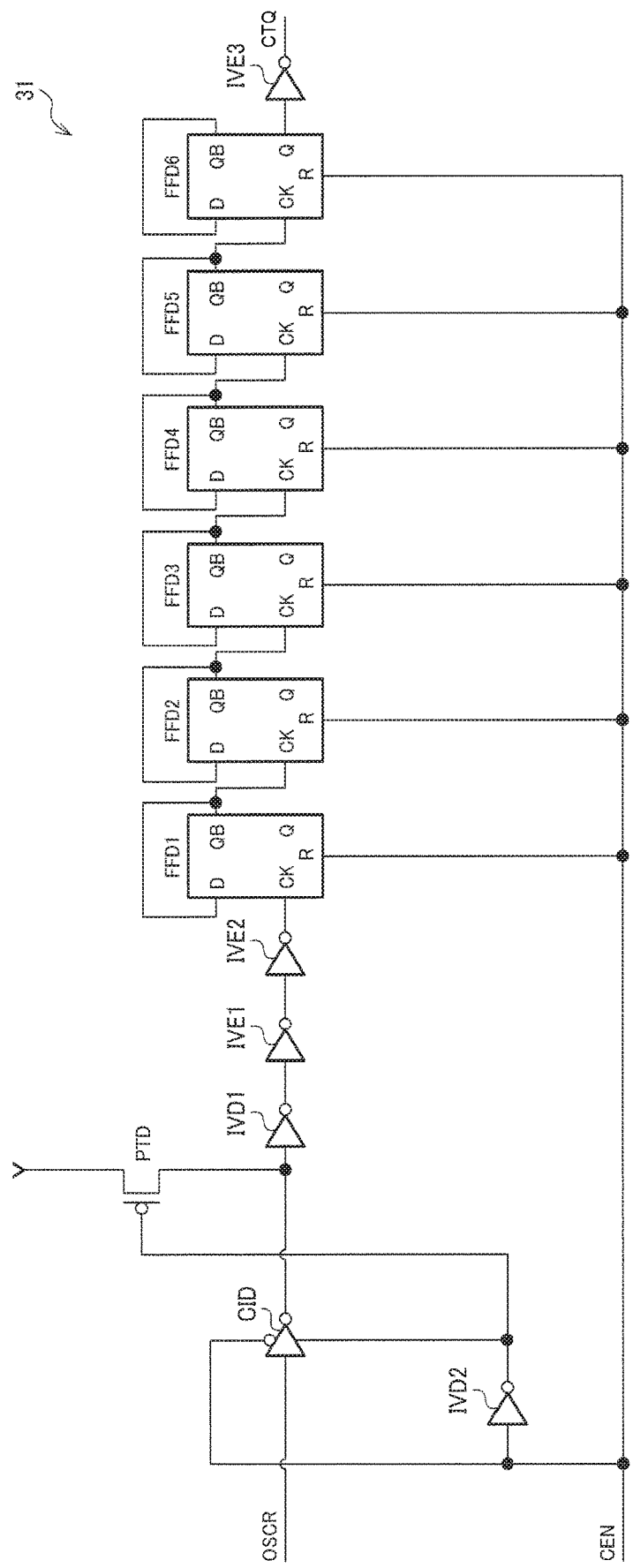
FIG. 9 is a diagram showing a detailed configuration example of a counter.

FIG. 9 shows a detailed configuration example of the counter 31. The counter 31 includes a clocked inverter CID, inverters IVD1, IVD2, IVE1 through IVE3, a transistor PTD (a P-type transistor, a first conductivity-type transistor), and flip-flop circuits FFD1 through FFD6. It should be noted that the present embodiment is not limited to the configuration shown in FIG. 9, but there can be adopted a variety of practical modifications such as elimination of some of the constituents or addition of other constituents.

In the case in which the count enable signal CEN is in the high level (the inactive state), the flip-flop circuits FFD1 through FFD6 are set to the reset state. Further, the output of the clocked inverter CID is set to the high-impedance state, the transistor PTD is set to the ON state, and the input of the inverter IVD1 is set to the voltage level (the high level) of the power supply VRD. Therefore, the output signal OSCR of the second oscillation circuit 70 is not input to the flip-flop circuits FFD1 through FFD6. As described above, in the case in which the count enable signal CEN is in the high level, the counter 31 is set to a non-operating state.

When the count enable signal CEN is set to the low level (the active state), the reset state of the flip-flop circuits FFD1 through FFD6 is released, and the flip-flop circuits FFD1 through FFD6 are set to an operating state. Further, the transistor PTD is set to the OFF state, and the output signal OSCR of the second oscillation circuit 70 is input to the flip-flop circuit FFD1 via the clocked inverter CID and the inverter IVD1. Thus, it becomes that the flip-flop circuits FFD1 through FFD6 operate based on the output signal OSCR of the second oscillation circuit 70.

In the flip-flop circuit FFD1, the inverted output signal QB is fed back as the input signal D, and is at the same time input to the clock of the flip-flop circuit FFD2 in the next stage. The same applies to the flip-flop circuits FFD2 through FFD5, and the inverted output signal QB is fed back as the input signal D, and is at the same time input to the clock of the flip-flop circuit FFD in the next stage. Further, in the flip-flop circuit FFD6, the inverted output signal QB is fed back as the input signal D, and the output signal Q is output as the output signal CTQ of the counter 31 via the inverter IVE3. In other words, the flip-flop circuits FFD1 through FFD6 are a six-stage binary counter, and can also be regarded as a frequency divider circuit for dividing the frequency of the output signal OSCR of the second oscillation circuit 70 as an input into $2^{6-1}=32$. The output signal CTQ of the counter 31 switches from the low level to the high level when 32 clocks are counted from when starting counting the output signal OSCR of the second oscillation circuit 70.

Due to the counter 31 shown in FIG. 9, it becomes possible to set the output enable signal QEN to the active state when a predetermined period TKD elapses from when the count enable signal CEN has been set to the active state. For example, if the oscillation frequency of the second oscillation circuit 70 is 260 kHz, the length of the period TKD becomes about 123 μsec.

It should be noted that it is also possible to adopt a modified implementation of counting the output signal OSQ of the first oscillation circuit 10 using the counter 31. It should be noted that the oscillation frequency of the first oscillation circuit 10 is high compared to the oscillation frequency of the second oscillation circuit 70. Therefore, in the case of performing the modified implementation, the maximum value (the frequency division ratio when regarded as the frequency divider circuit) the counter 31 can count needs to be made higher compared to the present embodiment, and therefore, the circuit scale of the counter 31 increases. Further, in the case in which the circuit scale of the counter 31 is not increased, the period TKD becomes shorter, and there is a possibility that the clock signal CLKO is output before the duty is stabilized.

Therefore, the method of the present embodiment is significantly advantageous in the point that it is possible to ensure the period TKD sufficient in length for the duty to be stabilized using the counter 31 having a simple circuit configuration such as a six-stage binary counter. It should be noted that the configuration shown in FIG. 9 is an example of the counter 31, and a variety of practical modifications can be adopted as the specific circuit configuration.

5. Modified Examples of Output Control Circuit

Figure 10:
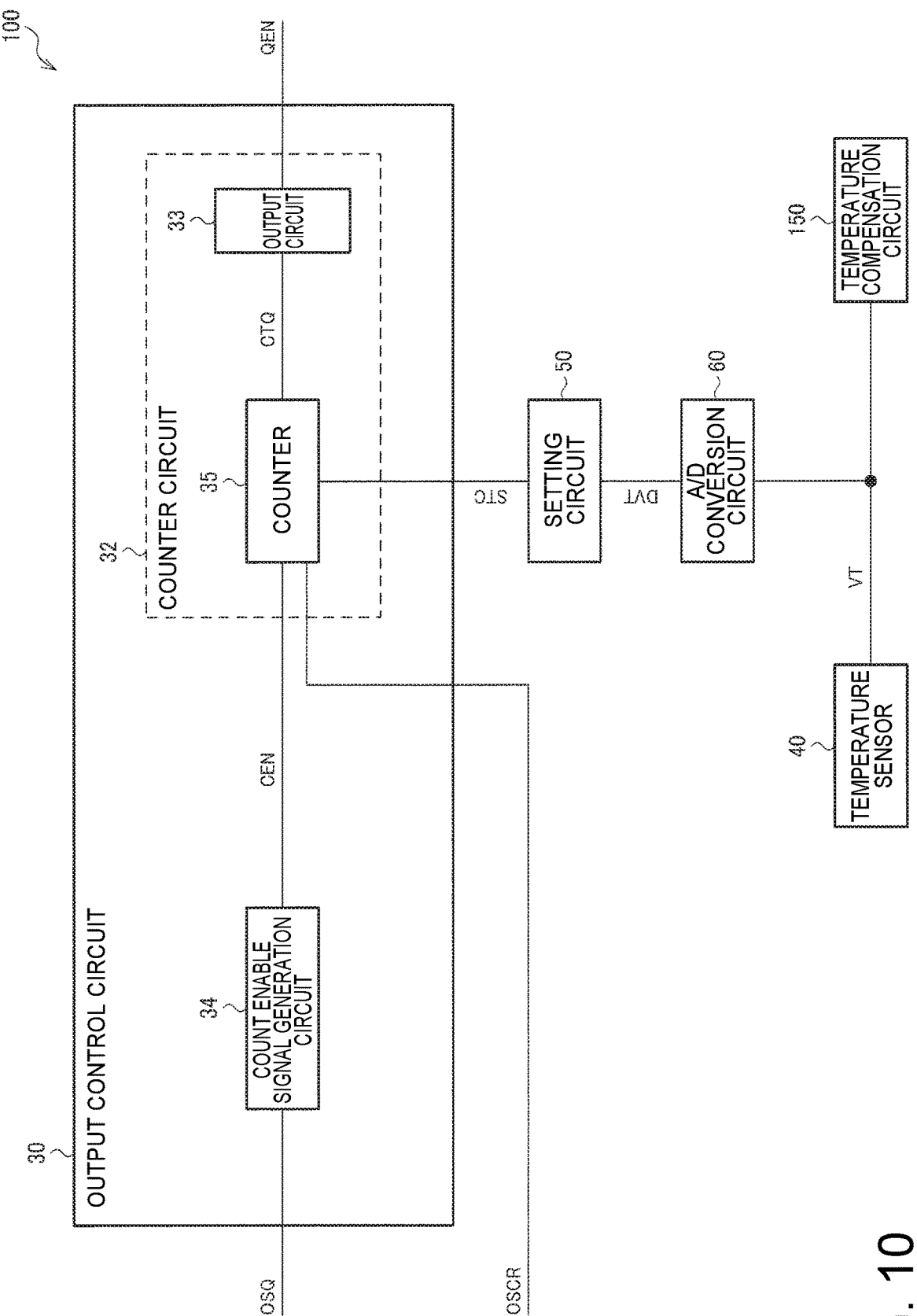
FIG. 10 is a diagram showing a modified example of the output control circuit, and a configuration example of the circuit device in the case of applying the modified example.

FIG. 10 shows a modified example of the output control circuit 30, and a configuration example of the circuit device 100 in the case of applying the modified example. In FIG. 10, the circuit device 100 includes the output control circuit 30, a temperature sensor 40, a setting circuit 50, an A/D conversion circuit 60, and a temperature compensation circuit 150 (a temperature compensation circuit). Further, the counter circuit 32 of the output control circuit 30 includes a counter 35 and the output circuit 33. It should be noted that the present embodiment is not limited to the configuration shown in FIG. 10, but there can be adopted a variety of practical modifications such as elimination of some of the constituents or addition of other constituents. For example, the temperature sensor 40 and the A/D conversion circuit 60 can also be disposed outside the circuit device 100.

As described above, the counter circuit 32 sets the output enable signal QEN to the active state when the count value in the counting process reaches a given setting value. In the present modified example, the given setting value is made variable. Specifically, the setting circuit 50 variably sets the setting value STC, and then outputs the setting value STC to the counter 35, then the counter 35 compares the count value and the setting value STC with each other, and then sets the output enable signal QEN (the output signal CTQ) to the active state in the case in which it is determined that the count value has reached the setting value STC.

There is a possibility that the time from the start-up of the first oscillation circuit 10 to when the appropriate clock signal CLKO (e.g., a clock signal with an appropriate duty) can be obtained varies due to environmental factors and so on. In this regard, according to the present modified example, it is possible to set the appropriate given setting value (i.e., the period TKD in FIG. 2) in accordance with a variety of environmental factors and so on.

For example, in the present modified example, the given setting value is variably set in accordance with the environmental temperature (the temperature detected by the temperature sensor 40) of the circuit device 100. Specifically, the temperature compensation circuit 150 performs the temperature compensation of the oscillation frequency of the first oscillation circuit 10 based on a temperature detection signal VT from the temperature sensor 40. In the case of performing such temperature compensation, the given setting value is variably set based on the temperature detection signal VT. In FIG. 10, the A/D conversion circuit 60 performs the A/D conversion on the voltage level of the temperature detection signal VT, and then outputs temperature detection data DVT as the A/D conversion result of the voltage level thereof. The setting circuit 50 outputs the setting value STC based on the temperature detection data DVT. For example, the setting circuit 50 outputs the setting value STC referring to a look-up table having the temperature detection data DVT and the setting value STC so as to correspond to each other. Alternatively, it is also possible for the setting circuit 50 to perform arithmetic processing for obtaining the setting value STC from the temperature detection data DVT to output the setting value STC.

If the environmental temperature (e.g., the temperature of the resonator XTAL) varies, the time from the start-up of the first oscillation circuit 10 to when the appropriate clock signal CLKO can be obtained varies. In this regard, according to the present modified example, it is possible to set the appropriate given setting value (i.e., the period TKD in FIG. 2) based on the temperature detection signal VT from the temperature sensor 40. For example, the higher the temperature is, the larger the given setting value is made, and the longer the period shown in FIG. 2 is made.

It should be noted that the description is hereinabove presented citing the case of variably setting the given setting value in accordance with the environmental temperature as an example, but this is not a limitation. There can be assumed a setting method corresponding to a variety of environmental factors, for example, the given setting value is variably set in accordance with the individual difference (e.g., the process fluctuation) of the resonator XTAL or the circuit device 100. Further, the description is hereinabove presented citing the case in which the setting circuit 50 sets the given setting value based on the temperature detected by the temperature sensor 40 as an example, but this is not a limitation. For example, it is also possible that the given setting value can variably be set due to the register setting from the outside (e.g., a CPU) of the circuit device 100. Alternatively, it is possible to variably set the given setting value by writing the given setting value in the nonvolatile memory in the manufacturing process.

6. Clock Signal Output Circuit

Figure 11:
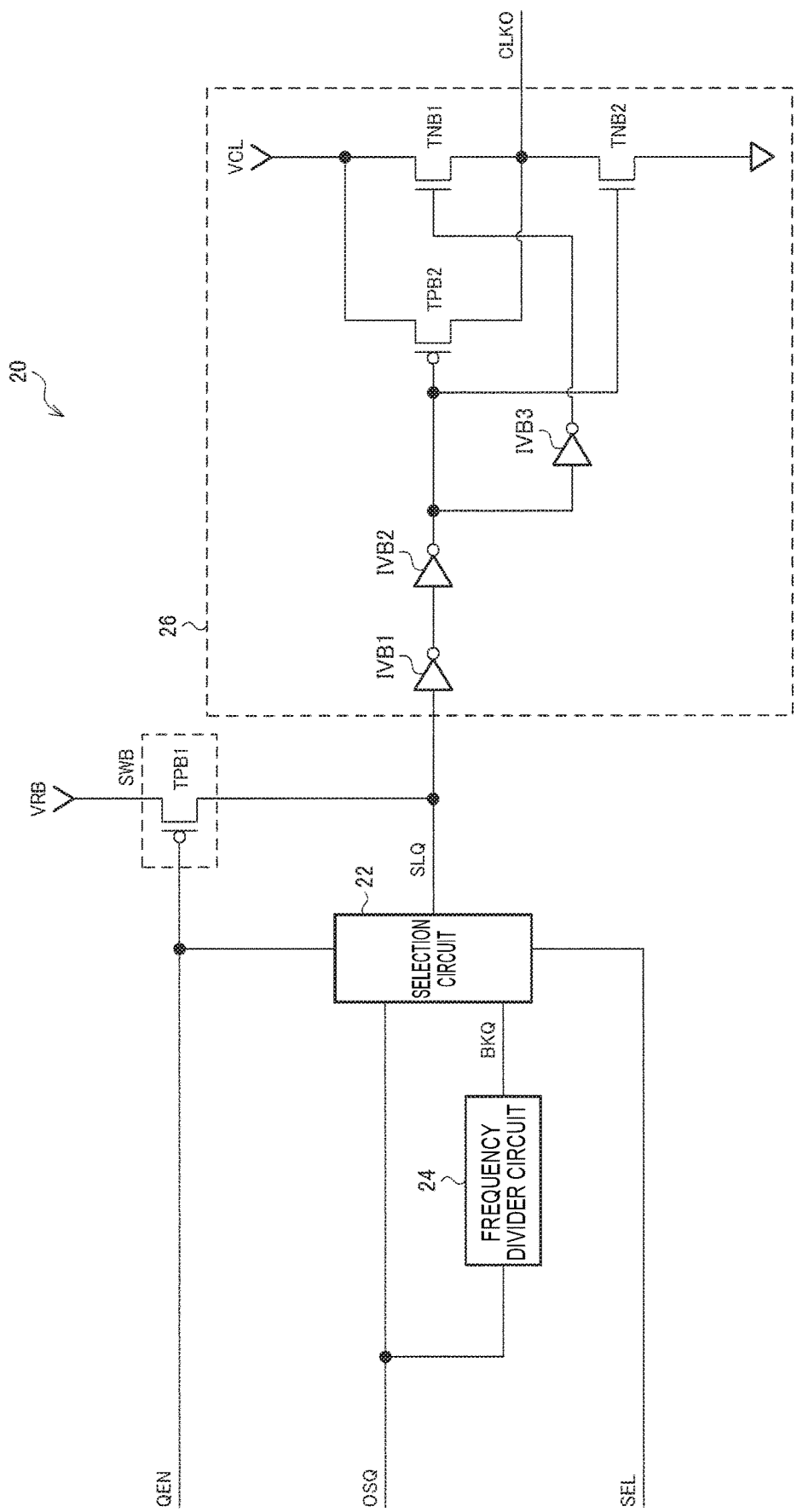
FIG. 11 is a diagram showing a detailed configuration example of a clock signal output circuit.

FIG. 11 shows a detailed configuration example of the clock signal output circuit 20. The clock signal output circuit 20 includes a selection circuit 22 (a selector), a frequency divider circuit 24, an output buffer 26, and a switch circuit SWB.

The frequency divider circuit 24 divides the frequency of the output signal OSQ of the first oscillation circuit 10, and then outputs the signal obtained by dividing the frequency of the output signal OSQ as a frequency-division signal BKQ. For example, the frequency division ratio of the frequency divider circuit 24 is 1/2, 1/4, or the like. In the case in which the output enable signal QEN is in the inactive state, the selection circuit 22 is in a high-impedance output state, and the switch circuit SWB sets the output (an output signal SLQ) of the selection circuit 22 to a given voltage level. For example, the given voltage level is a voltage level of the power supply VRB (a higher potential side power supply). In the case in which the output enable signal QEN is in the active state, the selection circuit 22 selects either one of the output signal OSQ of the first oscillation circuit 10 and the frequency-division signal BKQ, and then outputs the signal thus selected as the output signal SLQ.

Specifically, the switch circuit SWB is a transistor TPB1 (a P-type transistor, a first conductivity-type transistor). In the case in which the output enable signal QEN is in the low level (the active state), the transistor TPB1 is set to the OFF state, and the signal selected by the selection circuit 22 becomes to be input to the output buffer 26.

In the case in which the output enable signal QEN is in the active state, the selection circuit 22 selects either one of the output signal OSQ of the first oscillation circuit 10 and the frequency-division signal BKQ based on a selection signal SEL. The selection signal SEL is input from, for example, the control circuit (e.g., the control circuit 130 shown in FIG. 17) of the circuit device 100. For example, the information of the selection signal SEL is stored in the nonvolatile memory in the manufacturing process, and the control circuit outputs the selection signal SEL based on the information.

The output buffer 26 includes inverters IVB1 through IVB3, a transistor TPB2 (a P-type transistor, a first conductivity-type transistor), and transistors TNB1, TNB2 (N-type transistors, second conductivity-type transistors). In this output buffer 26, the transistors TPB2, TNB1, TNB2 drive the load to output the clock signal CLKO. The power supply VCL of these transistors is, for example, a low voltage of about 1 V. Therefore, the transistors TPB2, TNB1 are connected in parallel to each other (like a transfer gate) to ensure the drive capability. As described above, the output buffer 26 outputs the clock signal CLKO shaped like a clipped sine wave.

According to the present embodiment, in the case in which the output enable signal QEN is in the inactive state, the input voltage level of the output buffer 26 is fixed by the switch circuit SWB, and therefore, it is possible to set the clock signal CLKO to the inactive state (the non-output state). In contrast, in the case in which the output enable signal QEN is in the active state, the output signal OSQ of the first oscillation circuit 10 or the frequency-division signal BKQ selected by the selection circuit 22 is input to the output buffer 26, and therefore, it is possible to set the clock signal CLKO to the active state (the output state).

7. Selection Circuit

Figure 12:
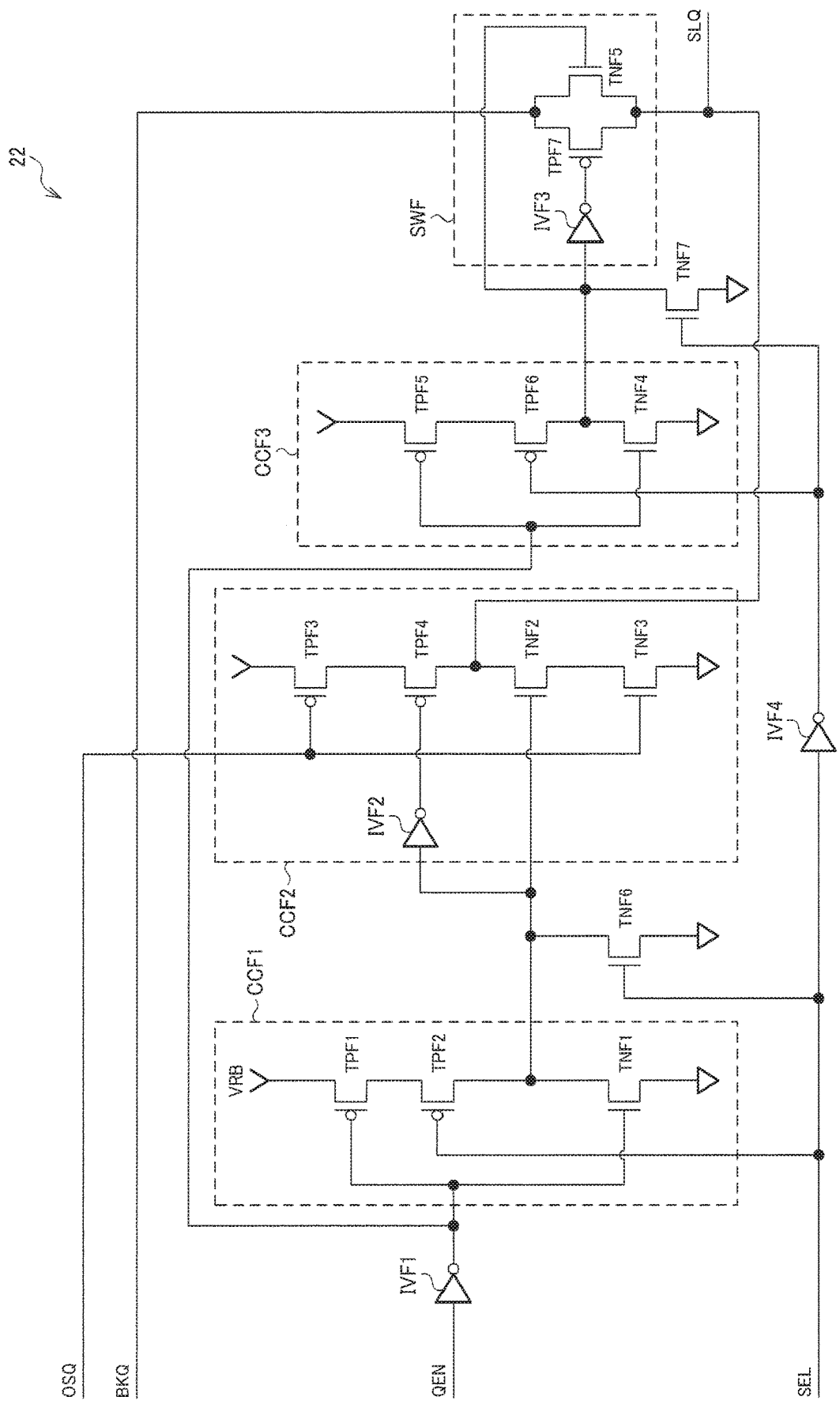
FIG. 12 is a diagram showing a detailed configuration example of a selection circuit.

FIG. 12 shows a detailed configuration example of the selection circuit 22. The selection circuit 22 includes inverters IVF1 through IVF3, transistors TPF1 through TPF7 (P-type transistors, first conductivity-type transistors), and transistors TNF1 through TNF7 (N-type transistors, second conductivity-type transistors).

Here, a circuit constituted by the transistors TPF1, TPF2, TNF1 is referred to as a circuit CCF1. A circuit constituted by the inverter IVF2, and the transistors TPF3, TPF4, TNF2, TNF3 is referred to as a circuit CCF2. A circuit constituted by the transistors TPF5, TPF6, TNF4 is referred to as a circuit CCF3. A circuit constituted by the inverter IVF3, and the transistors TPF7, TNF5 is referred to as a switch circuit SWF.

In the case in which the output enable signal QEN is in the low level (the inactive state), the transistor TNF1 of the circuit CCF1 turns to the ON state, and therefore, the output of the circuit CCF1 turns to the low level. Then, the transistors TPF4, TNF2 of the circuit CCF2 turn to the OFF state, and the output of the circuit CCF2 turns to the high-impedance state. Further, since the transistor TNF4 of the circuit CCF3 turns to the ON state, the output of the circuit CCF3 turns to the low level. Then, the transistors TPF7, TNF5 of the switch circuit SWF turn to the OFF state. According to the above process, the output of the selection circuit 22 turns to the high-impedance state.

In the case in which the output enable signal QEN is in the high level (the active state), the operation differs by the selection signal SEL. That is, in the case in which the selection signal SEL is in the low level, the transistors TPF1, TPF2 of the circuit CCF1 turn to the ON state, and therefore, the output of the circuit CCF1 turns to the high level. Then, the transistors TPF4, TNF2 of the circuit CCF2 turn to the ON state, and the circuit CCF2 buffers and then outputs the output signal OSQ of the first oscillation circuit 10. Further, since the transistor TNF7 disposed between the output node of the circuit CCF3 and a lower potential side power supply turns to the ON state, the output of the circuit CCF3 turns to the low level, and the transistors TPF7, TNF5 of the switch circuit SWF turn to the OFF state. According to the above process, the output signal SLQ of the selection circuit 22 turns to the output signal OSQ of the first oscillation circuit 10.

In contrast, in the case in which the output enable signal QEN is in the high level, and the selection signal SEL is in the high level, since the transistor TNF6 disposed between the output node of the circuit CCF1 and the lower potential side power supply turns to the ON state, the output of the circuit CCF1 turns to the low level. Then, the transistors TPF4, TNF2 of the circuit CCF2 turn to the OFF state, and the output of the circuit CCF2 turns to the high impedance state. Further, since the transistors TPF5, TPF6 of the circuit CCF3 turn to the ON state, the output of the circuit CCF3 turns to the high level. Then, the transistors TPF7, TNF5 of the switch circuit SWF turn to the ON state, and the switch circuit SWF transmits the frequency-division signal BKQ. According to the above process, the output signal SLQ of the selection circuit 22 turns to the frequency-division signal BKQ.

8. First Oscillation Circuit

Figure 13:
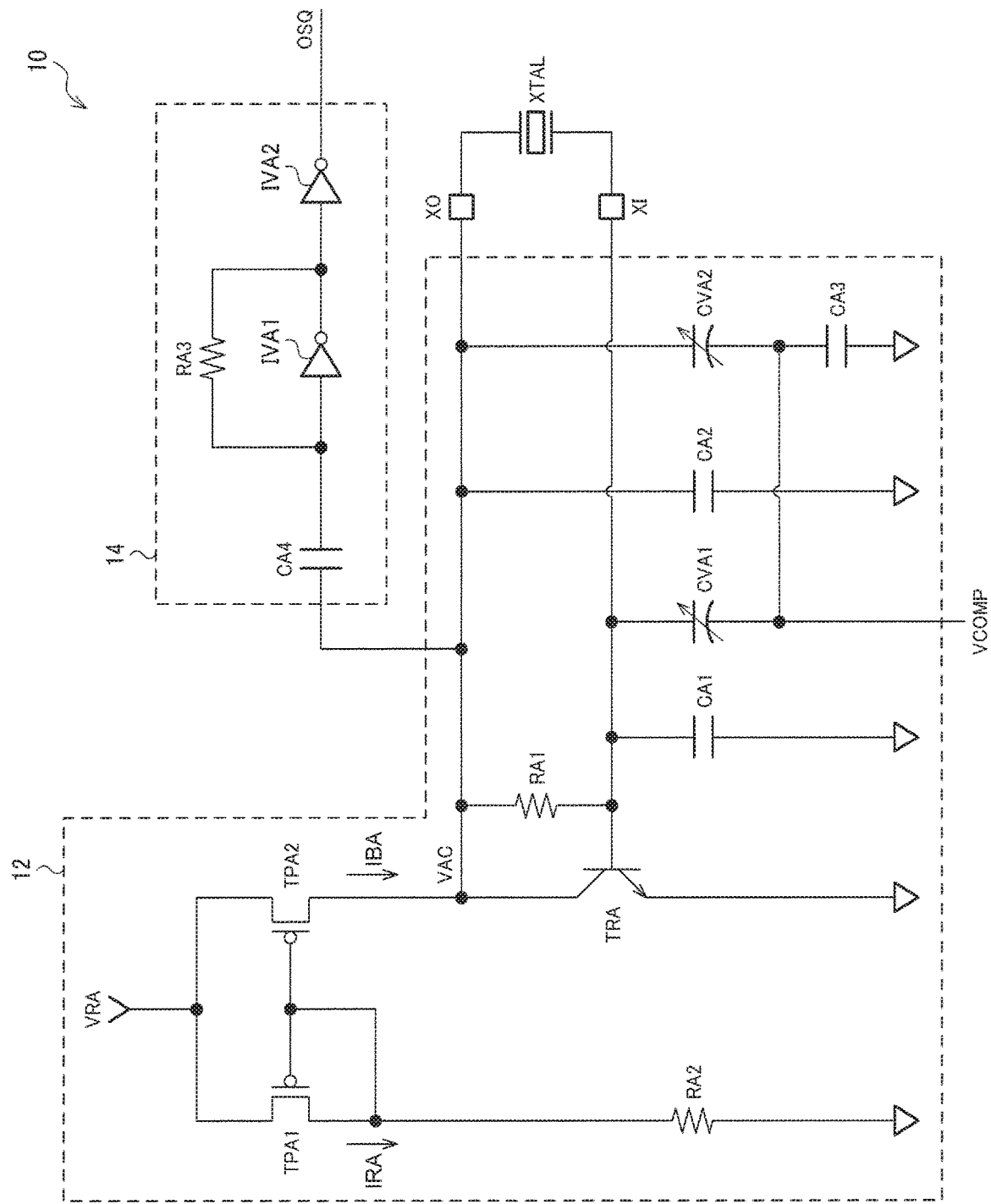
FIG. 13 is a diagram showing a detailed configuration example of the first oscillation circuit.

FIG. 13 shows a detailed configuration example of the first oscillation circuit 10. The first oscillation circuit 10 includes an oscillation section 12 (an oscillation circuit main body), and a buffer 14 (an amplification section).

The oscillation section 12 includes a current mirror circuit (a current source) constituted by transistors TPA1, TPA2 (P-type transistors, first conductivity-type transistors) and a resistive element RA2. The current mirror circuit mirrors the current IRA flowing through the resistive element RA2 to output a bias current IBA.

Further, the oscillation section 12 includes a bipolar transistor TRA, a resistive element RA1, capacitors CA1 through CA3, and varactors CVA1, CVA2 (variable capacitance diodes, variable capacitance capacitors). The collector terminal of the bipolar transistor TRA is connected to one end of the resonator XTAL via a terminal XO (a pad), and the base terminal is connected to the other end of the resonator XTAL via a terminal XI (a pad). Through the bipolar transistor TRA, there flows a base-emitter current generated by the oscillation of the resonator XTAL. When the base-emitter current increases, the collector-emitter current increases, and the bias current branched from the bias current IBA to the resistive element RA1 decreases, and therefore, the collector voltage VCA is lowered. In contrast, when the base-emitter current decreases, the collector-emitter current decreases, and the bias current branched from the bias current IBA to the resistive element RX increases, and therefore, the collector voltage VCA is raised. Since the collector voltage VCA is fed back to the resonator XTAL, the resonator XTAL oscillates.

The oscillation frequency of the resonator XTAL has a temperature characteristic, and the temperature characteristic is compensated by a temperature compensating voltage VCOMP generated by a temperature compensation circuit 150. Specifically, the temperature compensating voltage VCOMP is input to one ends of the varactors CVA1, CVA2, and the capacitance values of the varactors CVA1, CVA2 are controlled by the temperature compensating voltage VCOMP. The other ends of the varactors CVA1, CVA2 are connected to the base terminal and the collector terminal of the bipolar transistor TRA. When the capacitance values of the varactors CVA1, CVA2 change, the resonance frequency of the oscillation loop changes, and therefore, the variation of the oscillation frequency due to the temperature characteristic of the resonator XTAL is compensated.

It should be noted that the first oscillation circuit 10 according to the present embodiment is not limited to the configuration shown in FIG. 13, but a variety of types of oscillation circuits can be adopted. Further, in FIG. 13, the case of using the variable-capacitance capacitors as CVA1, CVA2 is described as an example. However, the present embodiment is not limited to this example, and it is also possible to use the variable-capacitance capacitor controlled by the temperature compensating voltage VCOMP as only either one of CVA1 and CVA2.

The buffer 14 includes a capacitor CA4, a resistive element RA3, and inverters IVA1, IVA2. To the inverter IVA1, there is input the collector voltage VCA (an oscillation signal) via the capacitor CA4. The output of the inverter IVA1 is fed back to the input thereof via the resistive element RA3, and thus, the bias point of the input of the inverter IVA1 is controlled. The inverter IVA2 buffers the output of the inverter IVA1, and then outputs the signal thus buffered as the output signal OSQ.

9. Second Oscillation Circuit

Figure 14:
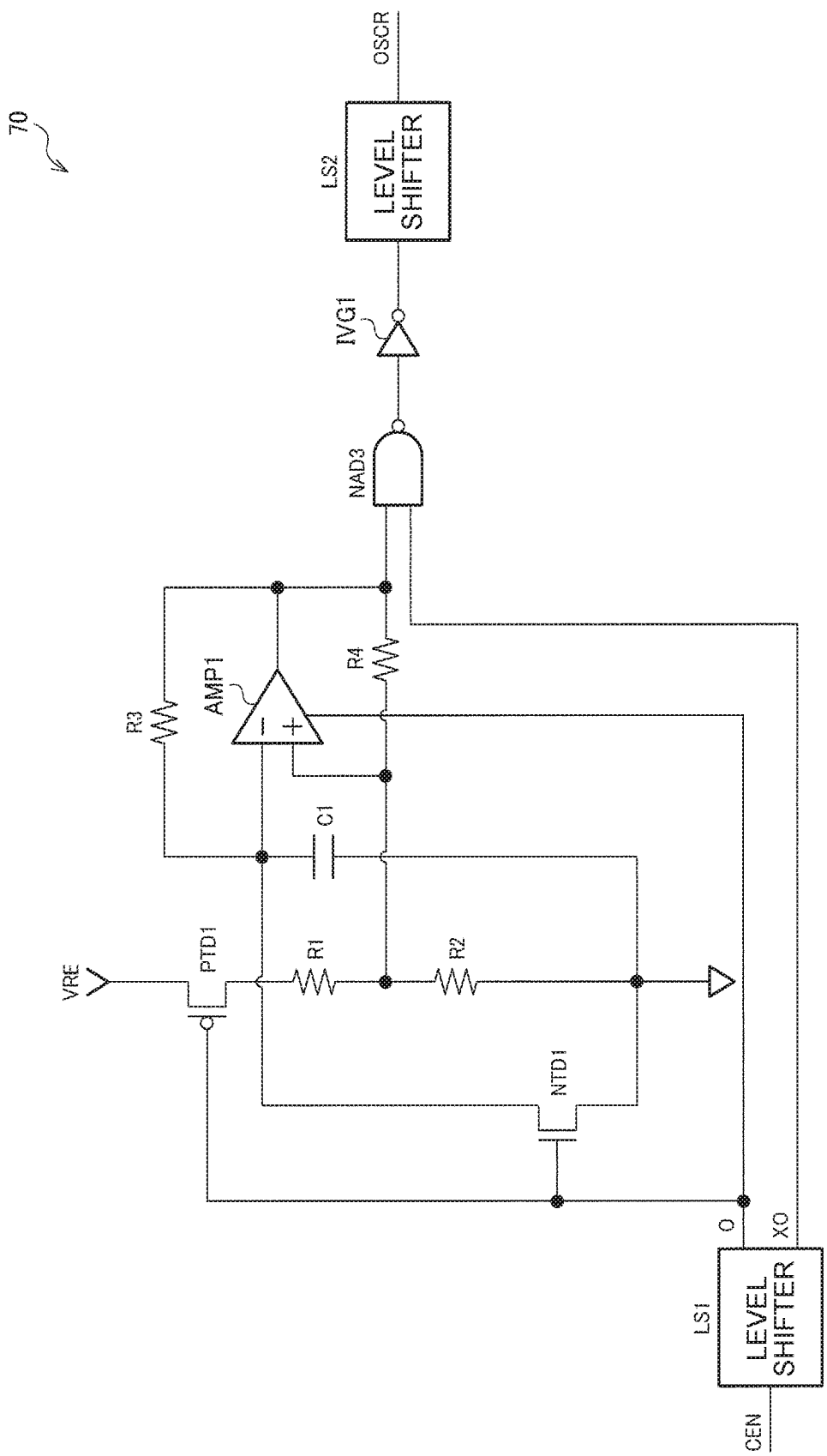
FIG. 14 is a diagram showing a detailed configuration example of a second oscillation circuit.

FIG. 14 shows a detailed configuration example of the second oscillation circuit 70. The second oscillation circuit 70 includes a differential amplifier circuit AMP1, resistors R1 through R4, a capacitor C1, a P-type transistor PTD1, an N-type transistor NTD1, a NAND circuit NAD3, an inverter IVG1, and level shifters LS1, LS2.

In the differential amplifier circuit AMP1, between an output terminal and an inverted input terminal, there is disposed the resistor R3 as a feedback resistor. Further, between the inverted input terminal and the lower potential side power supply, there is disposed the capacitor C1. Between the inverted input terminal and the lower potential side power supply, there is disposed the N-type transistor NTD1 in parallel to the capacitor C1.

Between the power supply VRE (the higher potential side power supply) and the lower potential side power supply, there are disposed the P-type transistor PTD1, the resistors R1, R2 in series to each other, and a node between the resistor R1 and the resistor R2 is connected to a non-inverted input terminal of the differential amplifier circuit AMP1.

The count enable signal CEN is input to the level shifter LS1. The level shifter LS1 outputs a signal, which is obtained by shifting the level of the count enable signal CEN to the power supply VRE level, from a terminal O. Further, the level shifter LS1 outputs a signal, which is obtained by shifting the level of the count enable signal CEN to the power supply VRE level, and then inverting the polarity, from a terminal XO. Therefore, the signal from the terminal O is set to the low level when the count enable signal CEN is in the active state (the low level), and the signal from the terminal XO is set to the high level when the count enable signal CEN is in the active state (the low level).

The signal from the terminal O is supplied to an enable terminal of the differential amplifier circuit AMP1, the gate terminal of the P-type transistor PTD1, and the gate terminal of the N-type transistor NTD1. The signal from the terminal XO is supplied to one input terminal of the NAND circuit NAD3.

When the count enable signal CEN turns to the active state (the low level), due to the signal output from the terminal O of the level shifter LS1, the differential amplifier circuit AMP1 turns to the enabled state, and the second oscillation circuit 70 (the CR oscillation circuit) also turns to the enabled state. Specifically, by charging and discharging the capacitor C1 with the output of the differential amplifier circuit AMP1 through the resistor R3, the oscillation is performed.

In the enabled state, since the signal output from the terminal XO of the level shifter LS1 is set to the high level, the NAND circuit NAD3 functions as an inverter. The oscillation signal obtained by the resistor R3 and the capacitor C1 is input to the level shifter LS2 via the NAND circuit NAD3 and the inverter IVG1, and the signal on which the level shift has been performed is output as the output signal OSCR of the second oscillation circuit 70.

In contrast, when the count enable signal CEN turns to the inactive state (the high level), the N-type transistor NTD1 turns to the ON state, and the P-type transistor PTD1 turns to the OFF state. Thus, the charge stored in the capacitor C1 is discharged, and at the same time, the non-inverted input of the differential amplifier circuit AMP1 is pulled down to the lower potential side power supply. Further, since the signal output from the terminal XO of the level shifter LS1 is in the low level, the output of the NAND circuit NAD3 is fixed to the high level, and the output signal OSCR of the second oscillation circuit 70 is fixed to the low level.

As described above, it is also possible for the second oscillation circuit 70 to start the oscillation operation when the count enable signal CEN turns to the active state. By adopting this process, it is possible to start the second oscillation circuit 70 in accordance with the start of the count in the counter circuit 32. Therefore, it is possible to prevent the start of the count from being delayed, and it is also possible to prevent an increase in power consumption caused by performing the oscillation operation in the situation in which the count is unnecessary.

Further, once the output of the clock signal CLKO is started, the counting process by the counter circuit 32 is thereafter unnecessary, and the necessity for the second oscillation circuit 70 to operate is low. Therefore, it is possible for the second oscillation circuit 70 to stop the oscillation operation when the output enable signal QEN turns to the active state after starting the oscillation operation (after the count enable signal CEN turns to the active state). By adopting this process, it becomes possible to reduce the power consumption in the second oscillation circuit 70.

Figure 15:
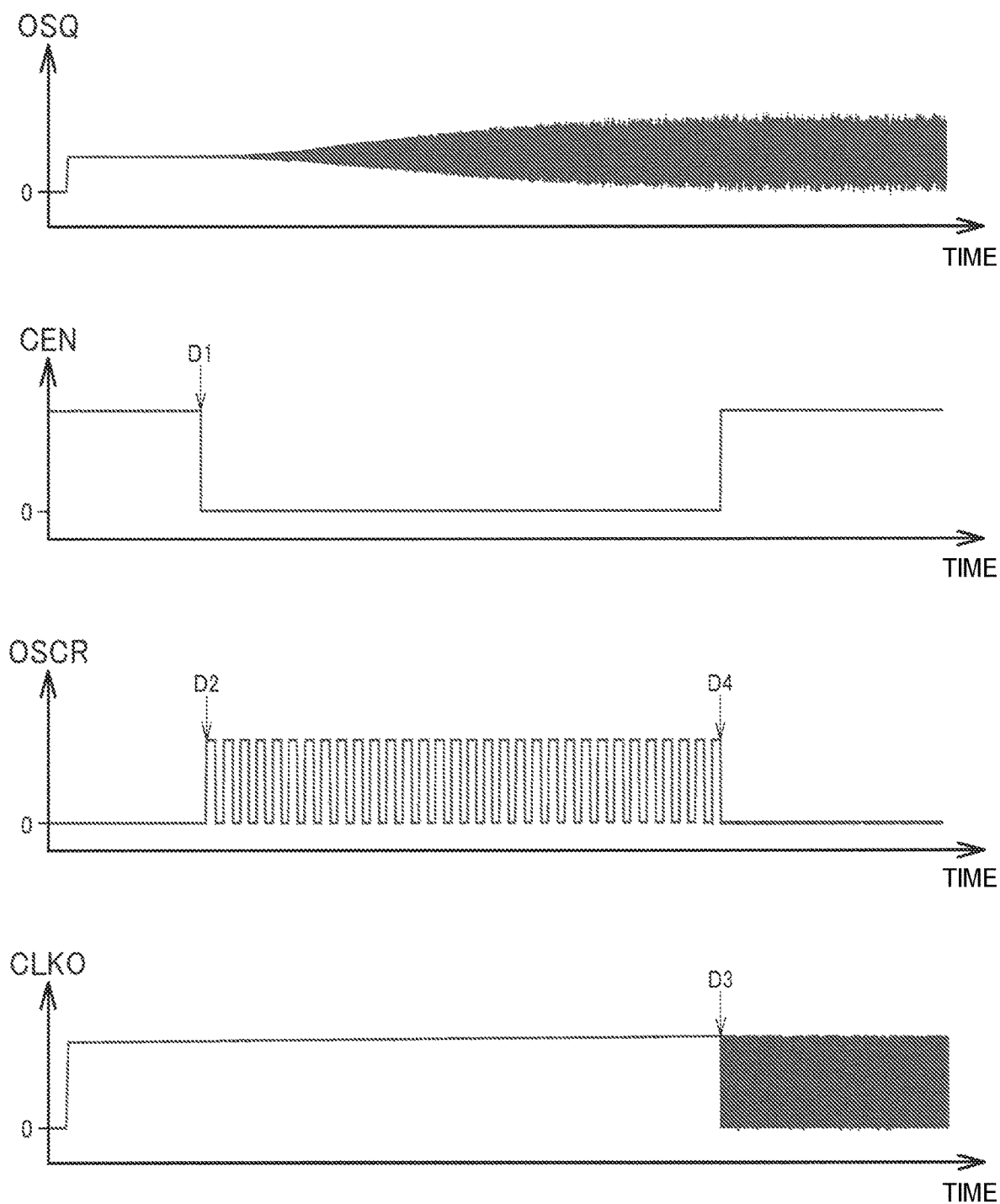
FIG. 15 is a diagram showing a signal waveform example in the embodiment.

FIG. 15 shows a waveform example of the output signal OSQ of the first oscillation circuit 10, the count enable signal CEN, the output signal OSCR of the second oscillation circuit 70, and the clock signal CLKO based on the control described above. As described above with reference to FIG. 2, at the time point when it is determined that the oscillation of the first oscillation circuit 10 has grown, the count enable signal CEN turns to (D1) the active state (the low level). The second oscillation circuit 70 starts (D2) the oscillation taking the fact that the count enable signal CEN has turned to the active state as a trigger. Then, at the timing at which the count of the output signal OSCR of the second oscillation circuit 70 has reached the setting value (e.g., 32), the output enable signal QEN turns to the active state, and the output of the clock signal CLKO is started (D3). The second oscillation circuit 70 stops (D4) the oscillation operation taking the fact that the output enable signal QEN has turned to the active state as a trigger.

10. Mode Switching

The control method for stabilizing the duty from the beginning of the output of the clock signal due to the output control circuit 30 is hereinabove described. It should be noted that it is unnecessary for the circuit device 100 according to the present embodiment to always perform the control described above. For example, it is also possible for the circuit device 100 to be configured so as to be able to switch between setting and non-setting of a duty correction mode as an operation mode for performing the control described above.

When the output control circuit 30 is set to the duty correction mode, the output control circuit 30 outputs the output enable signal QEN based on the result of the counting process to the clock signal output circuit 20. In contrast, when the output control circuit 30 is not set to the duty correction mode, the output control circuit 30 fixes the output enable signal QEN to the active level.

Figure 16:
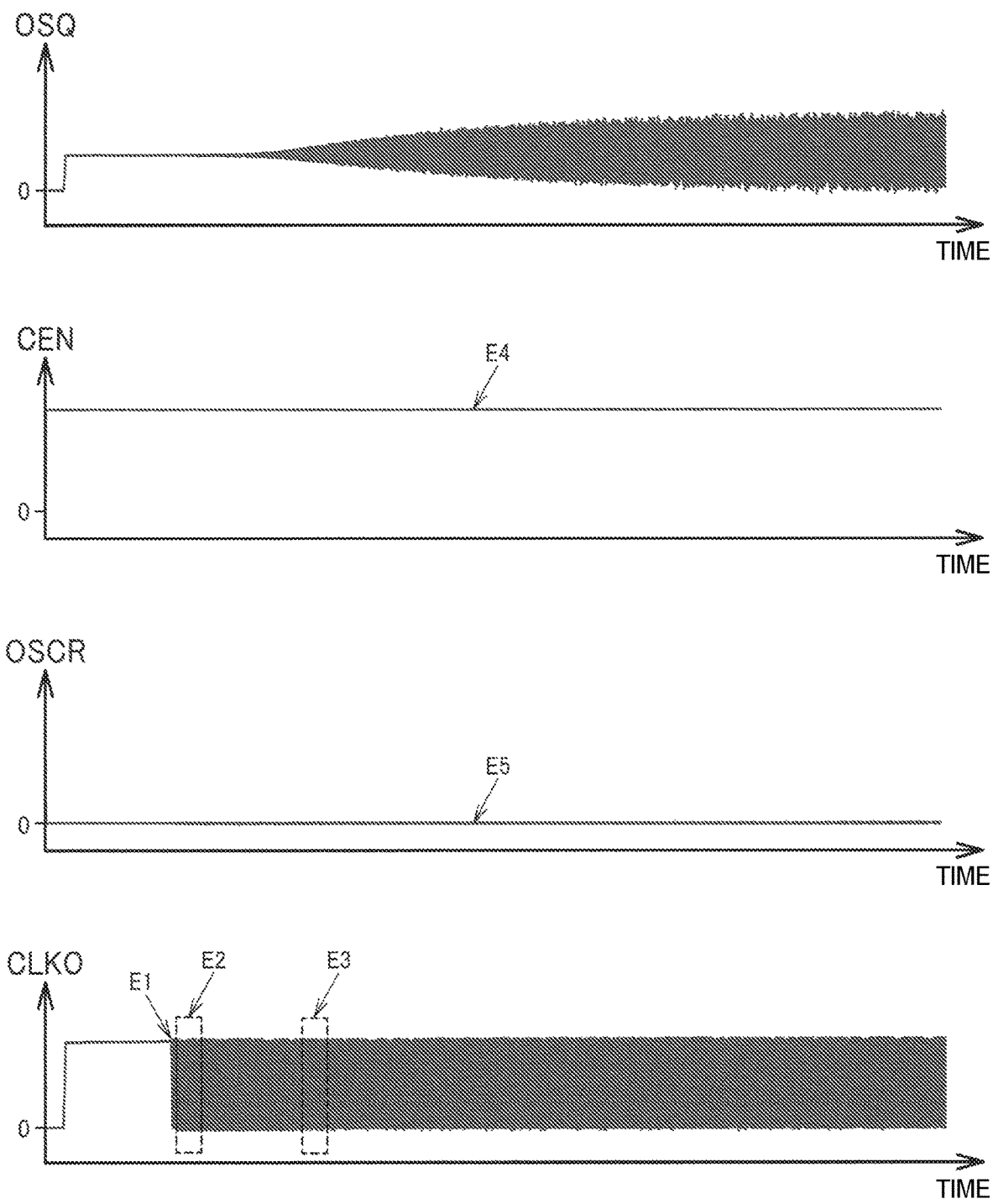
FIG. 16 is a diagram showing a signal waveform example when setting of a duty correction mode has not been performed.

FIG. 16 shows a waveform example of the output signal OSQ of the first oscillation circuit 10, the count enable signal CEN, the output signal OSCR of the second oscillation circuit 70, and the clock signal CLKO in the case in which the output control circuit 30 is not set to the duty correction mode. In this case, since the output enable signal QEN is fixed to the active level, the output of the clock signal is started (E1) at the time point at which the oscillation of the first oscillation circuit 10 has grown to some extent. In the clock signal CLKO, the duty is not stable as shown in FIG. 3 in the period (E2) immediately after starting the output, and the duty is stabilized as shown in FIG. 5 after the predetermined time has elapsed (E3). In other words, in the case in which the output control circuit 30 is not set to the duty correction mode, output of the clock signal with the unstable duty is allowed.

In this case, the counter circuit 32, the count enable signal generation circuit 34, and the second oscillation circuit 70 do not need to operate. Therefore, as shown in FIG. 16, the count enable signal CEN is fixed (E4) to the inactive state (the high level), and the second oscillation circuit 70 does not perform the oscillation operation (E5). By adopting this process, it becomes possible to reduce the power consumption of the circuit device 100.

Setting and non-setting of the duty correction mode can be switched in accordance with register setting. For example, in the case in which a given bit of the register is "1" (the first logic level, the high level), the output control circuit 30 is set to the duty correction mode, and in the case in which the given bit of the register is "0" (the second logic level, the low level), the output control circuit 30 is not set to the duty correction mode. By adopting this process, it becomes possible to change the operation of the output control circuit 30 in accordance with the situation using the register setting.

11. Detailed Configuration Example of Circuit Device

Figure 17:
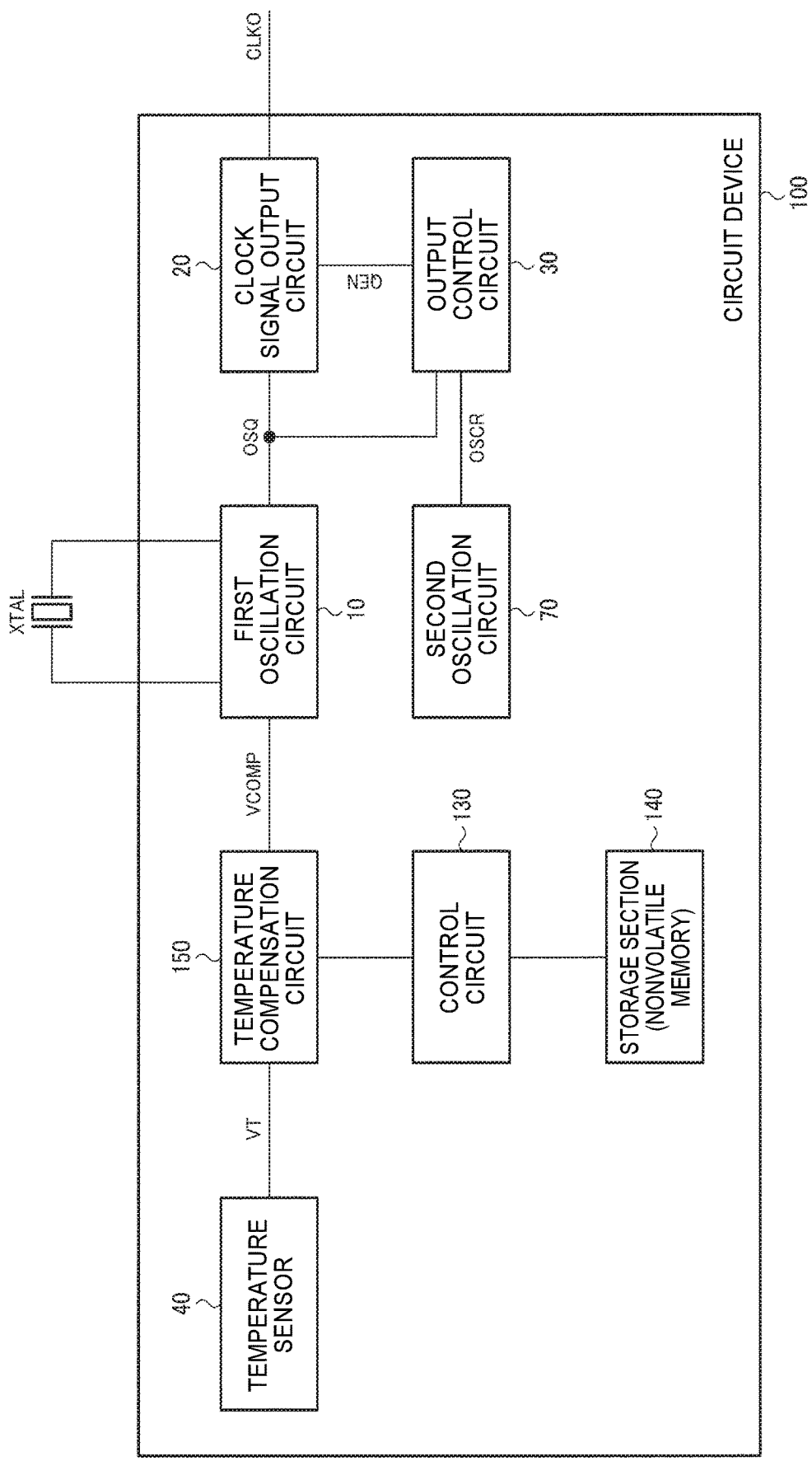
FIG. 17 is a diagram showing a first detailed configuration example of the circuit device according to the embodiment.

FIG. 17 shows a first detailed configuration example of the circuit device 100 according to the present embodiment. It should be noted that the description will hereinafter be presented citing the case of applying the circuit device 100 to the TCXO (or the OCXO) as an example, but this is not a limitation, and even in the case of not performing the temperature compensation, the system of the embodiment described above can be implemented.

The circuit device 100 includes the temperature sensor 40, the temperature compensation circuit 150 (a temperature compensation circuit), the control circuit 130, the storage section 140 (the nonvolatile memory), the first oscillation circuit 10, the clock signal output circuit 20, and the output control circuit 30, and the second oscillation circuit 70. It should be noted that the configuration of the circuit device is not limited to the configuration shown in FIG. 17, but a variety of practical modifications such as elimination of some of the constituents (e.g., the temperature sensor 40, the temperature compensation circuit 150) or addition of other constituents are possible.

The control circuit 130 performs control of each section of the circuit device 100. Further, the control circuit 130 also performs an interface process with an external device (e.g., a CPU) of the circuit device 100. The control circuit 130 is realized by a logic circuit such as a gate array.

The storage section 140 stores a variety of types of information necessary for the operation of the circuit device 100. The storage section 140 stores, for example, the information (e.g., coefficients of a polynomial equation used for the temperature compensation) necessary for the temperature compensation circuit 150 to perform the temperature compensation process. The information is written from the outside device (e.g., a test device) in, for example, the manufacturing process of the circuit device 100, or the manufacturing process of an oscillator housing the circuit device 100 and the resonator XTAL as a package.

The temperature compensation circuit 150 generates the temperature compensating voltage VCOMP for realizing the temperature compensation of the oscillation frequency of the first oscillation circuit 10 based on the temperature detection signal VT (the temperature detection voltage) from the temperature sensor 40, and then outputs the temperature compensating voltage VCOMP to the first oscillation circuit 10. For example, the temperature characteristic of the oscillation frequency provided to the resonator XTAL is measured by the test device, and then a cubic or quintic polynomial (an approximate expression) for canceling out (suppressing the variation of the oscillation frequency due to the temperature characteristic) the temperature characteristic is obtained. Then, the coefficients of the polynomial are written into the storage section 140. When the temperature compensation circuit 150 performs the temperature compensation, the control circuit 130 retrieves the coefficients of the polynomial from the storage section 140 to output the coefficients to the temperature compensation circuit 150, and then the temperature compensation circuit 150 generates the temperature compensating voltage VCOMP for canceling out (suppressing the variation of the oscillation frequency due to the temperature characteristic) the temperature characteristic of the oscillation frequency based on the coefficients. For example, citing the cubic polynomial as an example, the temperature compensation circuit 150 includes a first-order component generation circuit for generating the first-order component, a third-order component generation circuit for generating the third-order component, a first-order component amplifier circuit for amplifying the output of the first-order component generation circuit, a third-order component amplifier circuit for amplifying the output of the third-order component generation circuit, and an adder circuit for adding the output of the first-order component amplifier circuit and the output of the third-order component amplifier circuit to each other and then outputting the temperature compensating voltage VCOMP.

The temperature sensor 40 is a sensor for detecting the temperature of the circuit device 100 (a semiconductor chip). For example, the temperature sensor 40 can be formed of a diode (P-N junction) and so on. In this case, the temperature detection is performed using the temperature dependency of the forward voltage of the diode. Specifically, the temperature detection signal VT is output based on the forward voltage of the diode. It should be noted that the temperature sensor 40 is not limited to this example, but a variety of temperature sensors such as a thermistor can be adopted. Further, the configuration of using two oscillation circuits different in frequency temperature characteristic, and detecting the temperature based on the difference in oscillation frequency is also included in the invention. In this case, the oscillation circuit can be an oscillation circuit using an resonator, and can also be a ring oscillator, an RC oscillation circuit, and so on. Further, it is also possible to use the first oscillation circuit 10 for generating the oscillation signal as one of the oscillation circuits.

Figure 18:
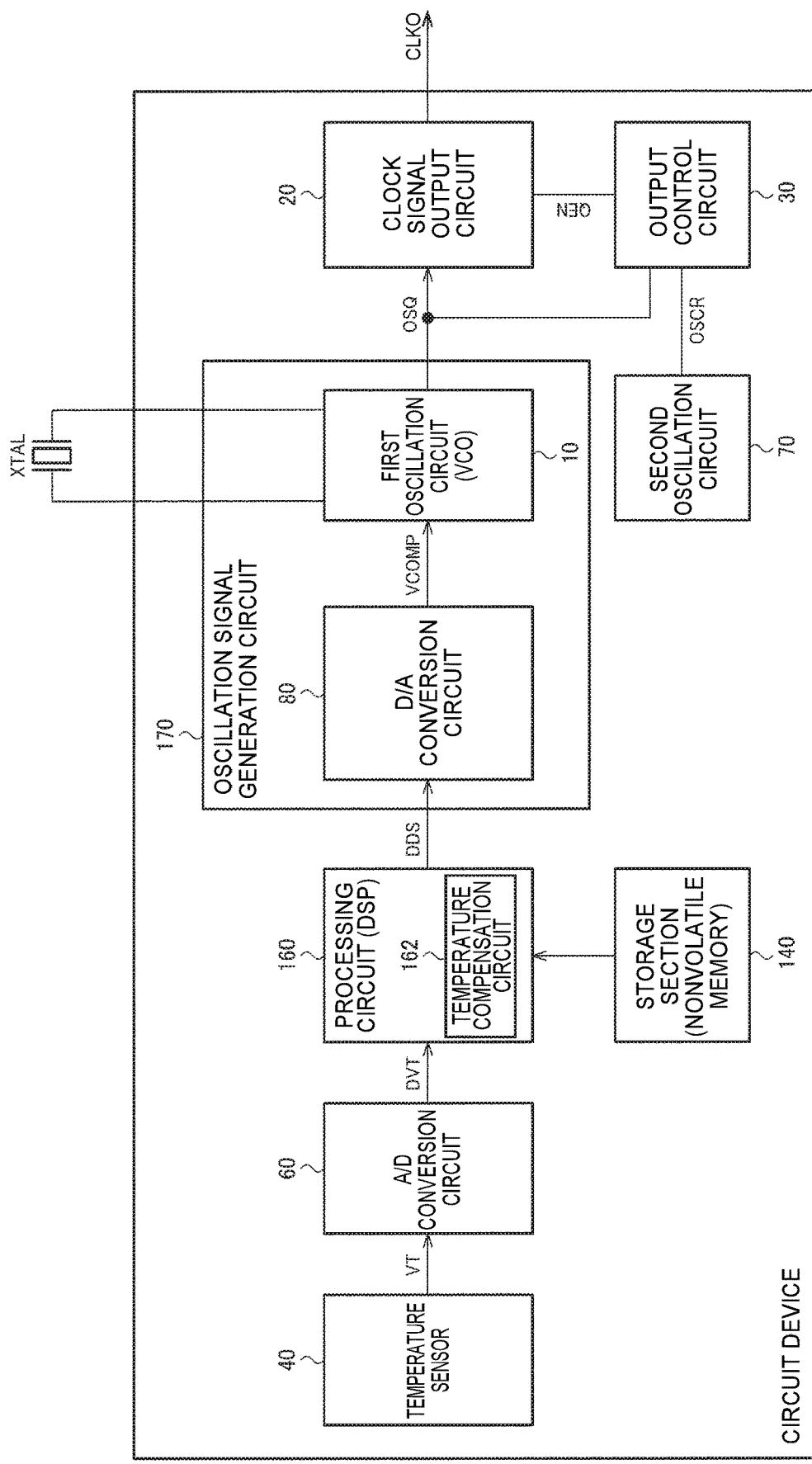
FIG. 18 is a diagram showing a second detailed configuration example of the circuit device according to the embodiment.

FIG. 18 shows a second detailed configuration example of the circuit device 100 according to the present embodiment. FIG. 18 shows a configuration example of a so-called digital TCXO (or a digital OCXO) for performing the temperature compensation using digital signal processing. The circuit device 100 shown in FIG. 18 includes the temperature sensor 40, the A/D conversion circuit 60 (the A/D conversion circuit), a processing section 160 (a DSP section, a processing circuit), the storage section 140 (the nonvolatile memory), a oscillation signal generation circuit 170, the clock signal output circuit 20, the output control circuit 30, and the second oscillation circuit 70. It should be noted that the configuration of the circuit device is not limited to the configuration shown in FIG. 18, but various practical modifications such as elimination of some of the constituents or addition of other constituents are possible.

The A/D conversion circuit 60 performs the A/D conversion on the temperature detection signal VT, and then outputs the digital data obtained by the A/D conversion as the temperature detection data DVT. As the A/D conversion method, it is possible to assume, for example, a successive approximation type, a double integral type, a flash type, and a pipeline type.

The processing section 160 performs a variety of digital signal processing to generate frequency control data DDS, and then outputs the frequency control data DDS to the oscillation signal generation circuit 170. For example, the processing section 160 includes a temperature compensation circuit 162. The temperature compensation circuit 162 performs the temperature compensation process based on the temperature detection data DVT to generate the frequency control data DDS for canceling out (suppressing the variation of the oscillation frequency due to the temperature characteristic) the temperature characteristic of the oscillation frequency provided to the resonator XTAL. In the temperature compensation process, the frequency control data DDS is calculated based on a cubic or quintic polynomial for canceling out (suppressing the variation of the oscillation frequency due to the temperature characteristic) the temperature characteristic of the oscillation frequency. The coefficients of the polynomial are written into the storage section 140 in the manufacturing process and so on in a similar manner as shown in FIG. 17.

The oscillation signal generation circuit 170 generates the oscillation signal (the output signal OSQ) using the resonator XTAL and the frequency control data DDS. Specifically, the oscillation signal generation circuit 170 generates the oscillation signal (the output signal OSQ) with the oscillation frequency corresponding to the frequency control data DDS using the resonator XTAL. For example, the oscillation signal generation circuit 170 includes a D/A conversion circuit 80, and the first oscillation circuit 10 (VCO). The D/A conversion circuit 80 performs the D/A conversion on the frequency control data DDS, and then outputs the voltage obtained by performing the D/A conversion to the first oscillation circuit 10 as the temperature compensating voltage VCOMP. The first oscillation circuit 10 oscillates the resonator XTAL at the oscillation frequency corresponding to the temperature compensating voltage VCOMP.

12. Oscillator, Electronic Apparatus, and Vehicle

Figure 19:
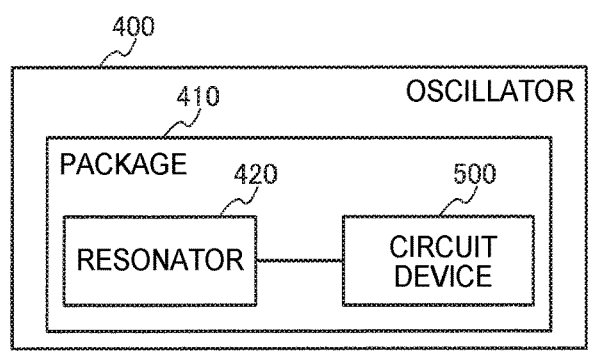
FIG. 19 is a diagram showing a configuration example of an oscillator.

FIG. 19 shows a configuration example of an oscillator 400 including the circuit device according to the present embodiment. As shown in FIG. 19, the oscillator 400 includes an resonator 420 (a resonator) and a circuit device 500. The resonator 420 and the circuit device 500 are mounted in a package 410 of the oscillator 400. Further, terminals of the resonator 420 and terminals (pads) of the circuit device 500 (IC) are electrically connected respectively to each other with interconnections of the package 410.

Figure 20:
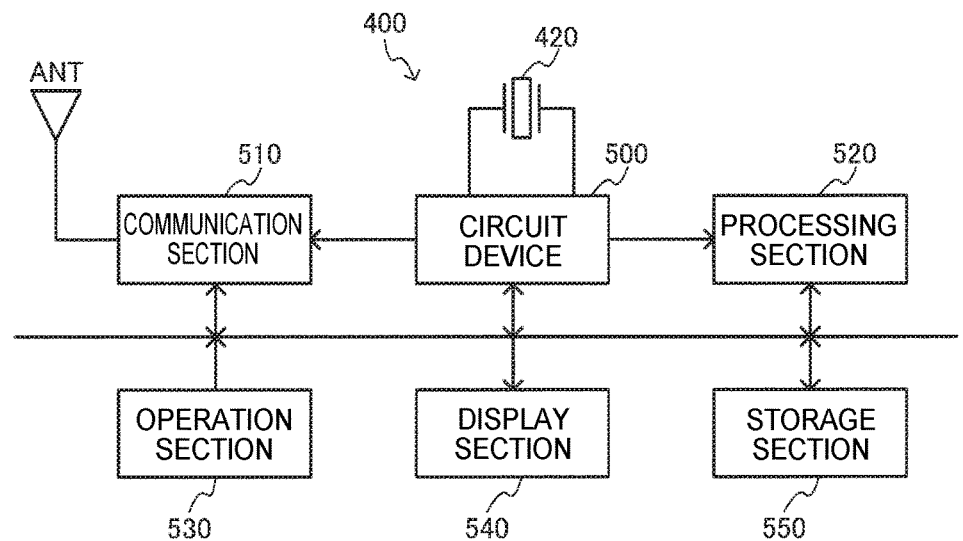
FIG. 20 is a diagram showing a configuration example of an electronic apparatus.

FIG. 20 shows a configuration example of an electronic apparatus including the circuit device according to the present embodiment. The electronic apparatus includes the circuit device 500, the resonator 420 such as a quartz crystal resonator, an antenna ANT, a communication section 510 (a communication device), and a processing section 520 (a processing device). Further, the electronic apparatus can include an operation section 530 (an operation device), a display section 540 (a display device), and a storage section 550 (a memory). The resonator 420 and the circuit device 500 constitute the oscillator 400. It should be noted that the electronic apparatus is not limited to the configuration shown in FIG. 20, but a variety of practical modifications such as elimination of some of the constituents or addition of other constituents can be adopted.

As the electronic apparatus shown in FIG. 20, there can be assumed a variety of apparatuses such as a wearable apparatus such as a timepiece incorporating GPS, a biological information measurement apparatus (e.g., a sphygmograph or a pedometer), or a head-mounted display device, a portable information terminal (a mobile terminal) such as a smartphone, a cellular phone, a portable video game player, a laptop PC, or a tablet PC, a content supply terminal for delivering contents, a video apparatus such as a digital camera or a video camera, or a network-related apparatus such as a base station, or a router.

The communication section 510 (a wireless circuit) performs a process of receiving data externally via the antenna ANT and transmitting data to the outside. The processing section 520 performs a control process of the electronic apparatus, a variety of types of digital processing of the data transmitted or received via the communication section 510. The function of the processing section 520 can be realized by a processor such as a microcomputer. The operation section 530 is for allowing the user to perform an input operation, and can be realized by operation buttons, a touch panel display, and so on. The display section 540 is for displaying a variety of types of information, and can be realized by a display using a liquid crystal, an organic EL, and so on. It should be noted that in the case of using the touch panel display as the operation section 530, it results that the touch panel display also functions as the operation section 530 and the display section 540. The storage section 550 is for storing the data, and the function thereof can be realized by a semiconductor memory such as a RAM or a ROM, a hard disk drive (HDD), or the like.

Figure 21:
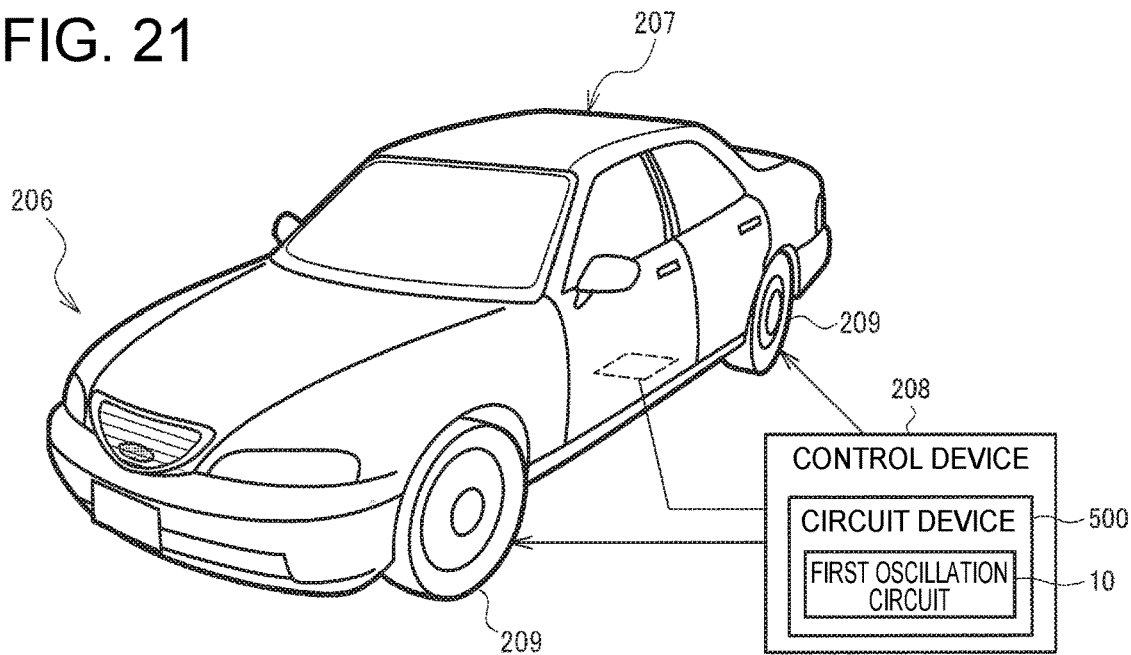
FIG. 21 is a diagram showing a configuration example of a vehicle.

FIG. 21 shows an example of a vehicle including the circuit device according to the present embodiment. The circuit device (the oscillator) according to the present embodiment can be incorporated in a variety of vehicles such as a car, an airplane, a motorbike, a bicycle, a ship, or a boat. The vehicle is equipment or an apparatus, which is provided with a drive mechanism such as an engine or an electric motor, a steering mechanism such as a steering wheel or a helm, and a variety of electronic apparatuses (in-car equipment), and moves on the ground, in the air, or on the sea. FIG. 21 schematically shows a car 206 as a specific example of the vehicle. The car 206 incorporates an oscillator (not shown) having the circuit device according to the present embodiment and a resonator. A control device 208 operates with the clock signal generated by the oscillator. The control device 208 controls the stiffness of the suspension in accordance with, for example, the attitude of a car body 207, and controls the brake of each of the wheels 209. For example, it is also possible to realize automated driving of the car 206 using the control device 208. It should be noted that the apparatus incorporating the circuit device or the oscillator according to the present embodiment is not limited to such a control device 208, but the circuit device or the oscillator according to the present embodiment can be incorporated in a variety of apparatuses (in-car equipment) provided to a vehicle such as the car 206.

It should be noted that although the present embodiment is hereinabove described in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the invention. Further, the configurations and the operations of the circuit device, the oscillator, the electronic apparatus, and the vehicle are not limited to those explained in the present embodiment, but can be implemented with a variety of modifications.

The entire disclosure of Japanese Patent Application No. 2017-089278, filed Apr. 28, 2017 is expressly incorporated by reference herein.

What is claimed is:

1. A circuit device comprising:
a first oscillation circuit adapted to oscillate an resonator;
a second oscillation circuit;
a clock signal output circuit adapted to output a clock signal based on an output signal of the first oscillation circuit; and
an output control circuit adapted to control the clock signal output circuit,
wherein the output control circuit includes a counter circuit adapted to perform a counting process based on an output signal of the second oscillation circuit,
the counter circuit outputs an output enable signal of the clock signal to the clock signal output circuit based on a result of the counting process,
the output control circuit includes a count enable signal generation circuit adapted to generate a count enable signal of the counter circuit,
the counter circuit starts the counting process when the count enable signal turns to an active state, and
the second oscillation circuit starts an oscillation operation when the count enable signal turns to an active state, and then stops the oscillation operation when the output enable signal turns to the active state.

2. The circuit device according to claim 1, wherein
an oscillation frequency of the second oscillation circuit is lower than an oscillation frequency of the first oscillation circuit.

3. The circuit device according to claim 1, wherein
defining a period from when a power supply voltage is applied to when an oscillation frequency of the first oscillation circuit is set in an allowable frequency deviation as T1, and defining a period from when the power supply voltage is applied to when the output enable signal turns to the active state as T2, T2<T1 is true.

4. An oscillator comprising:
the circuit device according to claim 1; and
the resonator.

5. An electronic apparatus comprising:
the circuit device according to claim 1.

6. A vehicle comprising:
the circuit device according to claim 1.

7. A circuit device comprising:
a first oscillation circuit adapted to oscillate an resonator;
a second oscillation circuit;
a clock signal output circuit adapted to output a clock signal based on an output signal of the first oscillation circuit; and
an output control circuit adapted to control the clock signal output circuit,
wherein the output control circuit includes a counter circuit adapted to perform a counting process based on an output signal of the second oscillation circuit,
the counter circuit outputs an output enable signal of the clock signal to the clock signal output circuit based on a result of the counting process,
in a case in which the output control circuit is set to a duty correction mode, the output control circuit outputs the output enable signal based on a result of the counting process to the clock signal output circuit, and
in a case in which the output control circuit fails to be set to the duty correction mode, the output control circuit fixes the output enable signal to an active level.

8. The circuit device according to claim 7, wherein
the output control circuit includes a count enable signal generation circuit adapted to generate a count enable signal of the counter circuit, and
the counter circuit starts the counting process when the count enable signal turns to an active state.

9. An oscillator comprising:
the circuit device according to claim 7; and
the resonator.

10. An electronic apparatus comprising:
the circuit device according to claim 7.

11. The circuit device according to claim 8, wherein
the count enable signal generation circuit generates the count enable signal based on the output signal of the first oscillation circuit.

12. The circuit device according to claim 8, wherein
the counter circuit starts the counting process when the count enable signal turns to the active state, and then, sets the output enable signal to the active state when a count value in the counting process reaches a given setting value.

13. The circuit device according to claim 1, wherein
the second oscillation circuit is a CR oscillation circuit.

14. A circuit device comprising:
a first oscillation circuit adapted to oscillate an resonator;
a second oscillation circuit;
a clock signal output circuit adapted to output a clock signal based on an output signal of the first oscillation circuit; and
an output control circuit adapted to control the clock signal output circuit,
wherein the output control circuit includes a counter circuit adapted to perform a counting process based on an output signal of the second oscillation circuit,
the counter circuit outputs an output enable signal of the clock signal to the clock signal output circuit based on a result of the counting process, and
the counter circuit includes
a counter adapted to perform a counting operation based on the output signal of the second oscillation circuit, and
an output circuit adapted to set the output enable signal to an inactive state in a case in which a reset signal is in the active state, and then set the output enable signal to the active state in a case in which the reset signal turns to an inactive state, and then an output signal of the counter turns to the active state.

15. An oscillator comprising:
the circuit device according to claim 8; and
the resonator.
16. An oscillator comprising:
the circuit device according to claim 11; and
the resonator.
17. An electronic apparatus comprising:
the circuit device according to claim 8.
18. A vehicle comprising:
the circuit device according to claim 8.
19. A vehicle comprising:
the circuit device according to claim 7.

* * * * *